(12) United States Patent
Matsuo

(10) Patent No.: US 10,083,979 B2
(45) Date of Patent: Sep. 25, 2018

(54) SEMICONDUCTOR DEVICE, MANUFACTURING METHOD AND CONTROLLING METHOD OF SEMICONDUCTOR DEVICE

(71) Applicant: TOSHIBA MEMORY CORPORATION, Tokyo (JP)

(72) Inventor: Kouji Matsuo, Aichi (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/462,619

(22) Filed: Mar. 17, 2017

(65) Prior Publication Data

US 2018/0083026 A1 Mar. 22, 2018

Related U.S. Application Data

(60) Provisional application No. 62/395,445, filed on Sep. 16, 2016.

(51) Int. Cl.
*G11C 11/34* (2006.01)
*G11C 16/04* (2006.01)
(Continued)

(52) U.S. Cl.
CPC .... *H01L 27/11575* (2013.01); *G11C 16/0466* (2013.01); *G11C 16/10* (2013.01);
(Continued)

(58) Field of Classification Search
CPC ......... H01L 27/11575; H01L 27/11565; H01L 27/11568; H01L 27/11582; G11C 6/0466; G11C 16/10; G11C 16/26
See application file for complete search history.

(56) References Cited

U.S. PATENT DOCUMENTS 7,729,164 B2 6/2010 Kim et al.
7,732,855 B2 6/2010 Park et al.
(Continued)

FOREIGN PATENT DOCUMENTS

JP 2008-103699 5/2008
JP 2009-99948 5/2009
(Continued)

*Primary Examiner* — Toan Le
(74) *Attorney, Agent, or Firm* — Finnegan, Henderson, Farabow, Garrett & Dunner, L.L.P.

(57) ABSTRACT

A semiconductor device includes a substrate, a semiconductor layer, first electrodes, data storage regions, first conductive regions, contacts and second conductive regions. The first electrodes are formed in the semiconductor layer arrayed in a first direction and a second direction and penetrating the insulator films and the semiconductor films in a third direction. The data storage regions are provided between each of the semiconductor films and each of the first electrodes. The first conductive regions are provided at one end of each of the semiconductor films in the first direction. The contacts are connected to one end of one of the first conductive regions in the second direction, and connection parts between each of the contacts and the first conductive regions are formed stepwise along the second direction. The second conductive regions are provided at the other end of the semiconductor layer in the first direction.

8 Claims, 34 Drawing Sheets

(51) Int. Cl.

| | |
|---|---|
| *H01L 27/11575* | (2017.01) |
| *H01L 27/11565* | (2017.01) |
| *H01L 27/11568* | (2017.01) |
| *H01L 27/11582* | (2017.01) |
| *G11C 16/10* | (2006.01) |
| *G11C 16/26* | (2006.01) |
| *G11C 16/14* | (2006.01) |

(52) U.S. Cl.
CPC .............. *G11C 16/14* (2013.01); *G11C 16/26* (2013.01); *H01L 27/11565* (2013.01); *H01L 27/11568* (2013.01); *H01L 27/11582* (2013.01)

(56) References Cited

U.S. PATENT DOCUMENTS

| | | |
|---|---|---|
| 8,633,535 B2 | 1/2014 | Matsuo et al. |
| 2011/0233681 A1 | 9/2011 | Matsuo |
| 2012/0280303 A1 | 11/2012 | Kiyotoshi et al. |
| 2013/0270631 A1* | 10/2013 | Kim .................... H01L 29/7827 257/331 |
| 2013/0341706 A1 | 12/2013 | Matsuo |
| 2016/0093635 A1* | 3/2016 | Rabkin ............. H01L 21/02381 257/314 |
| 2017/0125433 A1* | 5/2017 | Ogawa ............. H01L 27/11556 |
| 2017/0263631 A1* | 9/2017 | Fujiki ................ H01L 27/11582 |
| 2017/0317096 A1* | 11/2017 | Shin .................. H01L 27/11575 |

FOREIGN PATENT DOCUMENTS

| | | |
|---|---|---|
| JP | 2011-204745 | 10/2011 |
| JP | 2011-258776 | 12/2011 |
| JP | 2012-234980 | 11/2012 |
| JP | 2014-7305 | 1/2014 |

\* cited by examiner

SEMICONDUCTOR DEVICE, MANUFACTURING METHOD AND CONTROLLING METHOD OF SEMICONDUCTOR DEVICE

CROSS-REFERENCE TO RELATED APPLICATIONS

This application is based upon and claims the benefit of priority from U.S. Provisional Application No. 62/395,445 filed on Sep. 16, 2016; the entire contents of which are incorporated herein by reference.

FIELD

The embodiments of the present invention relate to a semiconductor device, a manufacturing method and a controlling method of the semiconductor device.

BACKGROUND

To increase the integration degree of semiconductor memories, various memories having three-dimensional cells, including Bit Cost Scalable (BiCS) memories, have been suggested. Among these memories having three-dimensional cells, matrix channel stacked memories (MaCS) have been suggested as memories having three-dimensional cells, in which gate electrodes are embedded in a longitudinal direction and channel layers are laminated in a lateral direction.

The MaCSs read and write data in each cell as follows: a voltage is applied to the gate electrodes in a longitudinal direction to generate inversion layers around the gate electrodes; the generated inversion layers are interconnected to adjacent cells; and the interconnected inversion layers act as conduction paths of carriers (e⁻ or h⁺) from bit lines to cells desired to be accessed. For each plurality of cells to which these conduction paths are formed (hereinafter, these cells are referred to as strings), contact regions, which connect the bit lines and each of the channel layers, are formed stepwise along a string direction so as to be connected to each of the laminated channel layers.

However, in the above structure, stepwise regions along the string direction are required at the outside of the cell regions for each one of the strings, and it is thus difficult to reduce the areas of the cell regions.

DETAILED DESCRIPTION

According to one embodiment, a semiconductor device includes a substrate, a semiconductor layer, a plurality of first electrodes, a plurality of data storage regions, a plurality of first conductive regions, a plurality of contacts and a plurality of second conductive regions. The semiconductor layer is formed by alternately laminating a plurality of insulator films and a plurality of semiconductor films on the substrate. The plurality of the first electrodes are formed in the semiconductor layer by being arrayed in a first direction and a second direction and by penetrating the plurality of the insulator films and the plurality of the semiconductor films in a third direction. The first direction is horizontal to the surface of the semiconductor layer; the second direction intersects with the first direction and is horizontal to the surface of the semiconductor layer; and the third direction intersects with the first direction and the second direction. The plurality of the data storage regions are provided between each of the semiconductor films and each of the first electrodes. The plurality of the first conductive regions are provided at one end of each of the semiconductor films in the first direction. The plurality of the contacts are connected to one end of one of the first conductive regions in the second direction, and connection parts between each of the contacts and the first conductive regions are formed stepwise along the second direction. The plurality of the second conductive regions are provided at the other end of the semiconductor layer in the first direction.

Embodiments will now be explained with reference to the accompanying drawings. The present invention is not limited to the embodiments.

First Embodiment

In the semiconductor device according to the embodiments of the present invention, the contacts, which connect bit lines and each of the semiconductor layers in MaCS, are not disposed along the string direction of memory holes. Instead, the contacts are disposed along a direction which intersects with the string, thereby reducing the volumes occupied by regions other than the cell areas.

Figure 1:
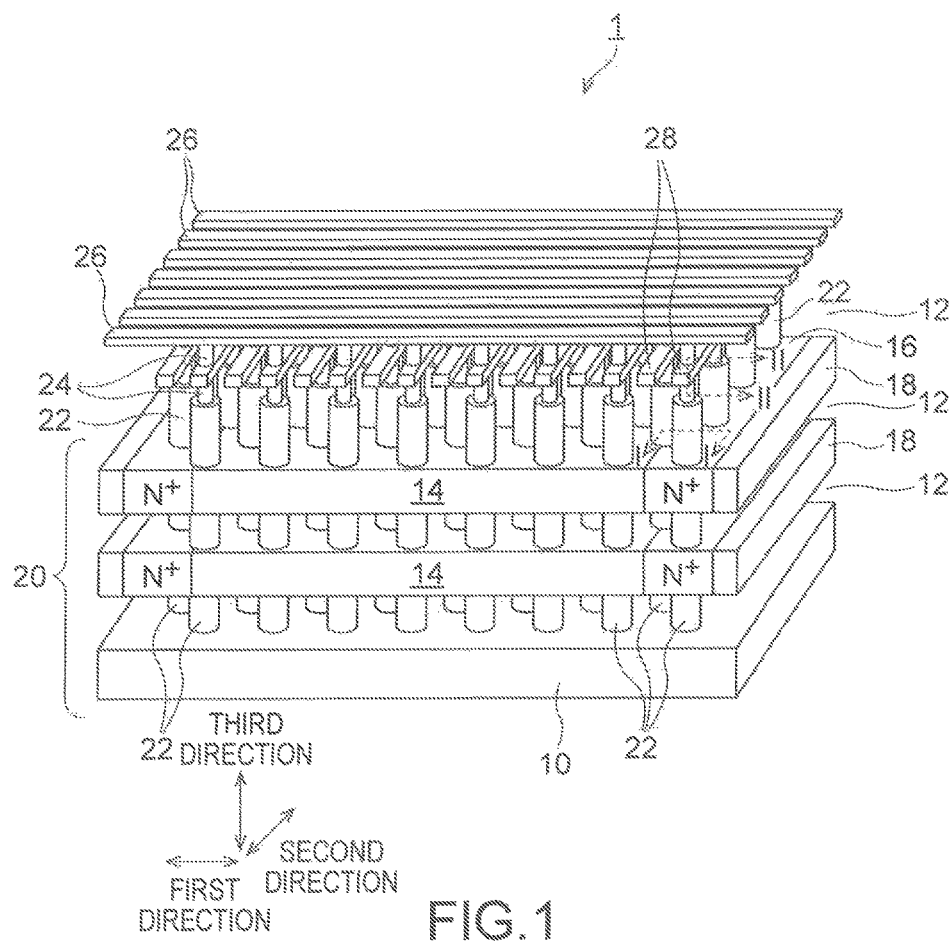
FIG. 1 is a perspective view schematically showing a simple overview of a semiconductor device according to the first embodiment.

FIG. 1 is a perspective view schematically showing a simple overview of a semiconductor device 1 according to the present embodiment. As shown in FIG. 1, the semiconductor device 1 according to the present embodiment is, for example, a MaCS of a three-dimensional cell memory, in which gate electrodes are embedded in a longitudinal direction and channel layers are laminated in a lateral direction. The semiconductor device 1 includes a substrate 10, a plurality of insulating films 12, a plurality of semiconductor films 14, a plurality of $n^+$ type conductive regions 16, a plurality of low resistance regions 18, a plurality of first electrode layers 22, a plurality of transistors 24, a plurality of first conducting wirings 26 and a plurality of second conducting wirings 28. For convenience of explanation, the plurality of the insulating films 12 are not illustrated in the drawing.

Note that the first direction, the second direction and the third direction are set as shown in FIG. 1. The first direction is a direction in which paths for electrically interconnecting the plurality of the first electrode layers 22 are formed at the semiconductor films 14, as described later. The semiconductor films 14 and the first electrode layer 22 forms Cell arrays, and the $n^+$ type conductive regions 16 are formed at both ends of the cell arrays in the first direction. Hereinafter, lines of the first electrode layers 22 along this first direction are referred to as strings. The second direction is a direction horizontal to the substrate 10, the insulating films 12 and the semiconductor films 14 as well as a direction orthogonal to the first direction. Mote that "orthogonal" in this context is not only required to be strictly orthogonal but also includes a case of being substantially orthogonal such as intersecting almost orthogonally. The same applies hereinafter. The third direction is a direction orthogonal to the first direction and the second direction and a direction orthogonal to the substrate 10, the insulating films 12 and the semiconductor films 14.

The substrate 10 is, for example, a semiconductor substrate such as a silicon wafer. The insulating films 12 are films made of an insulant for insulating between the semiconductor films 14 and for insulating between the semiconductor films 14 and various wirings and are formed plurally on the substrate 10 alternately with the plurality of the semiconductor films 14. These insulating films 12 are films made of, for example, silicon oxide ($SiO_2$). Moreover, the insulating films 12 are not limited this, and anything that can appropriately perform insulation including air gaps, liquid insulators and other solid insulators, may be used instead of the insulating films 12.

The semiconductor films 14 are layers that function as channels of memory cells and are, for example, films made of polysilicon to which n type impurities introduced. When a voltage is applied to the electrodes of the first electrode layers 22, by depletion layers generated at the semiconductor films 14, conduction paths are formed in the string direction between the $n^+$ type conductive regions 16 at both ends of the semiconductor films 14 in the first direction, and data are read and written in a selected memory cell. The plurality of these semiconductor films 14 and the plurality of these Insulating films 12 formed a semiconductor layer 20. Note that, although only two layers of the semiconductor films 14 are shown In FIG. 1 and the rest are omitted for explanation, the semiconductor films 14 are actually of 16 layers or 32 layers and can be of more layers such as 48 layers, 64 layers, 96 layers or 128 layers.

The $n^+$ type conductive regions 16 are highly concentrated conductive layers for supplying carriers to a selected string, to which a selected memory cell belongs, when the aforementioned conduction paths are formed at the strings. The $n^+$ type conductive regions 16 are highly concentrated, for example, n type conductive layers formed by introducing phosphorus (P) ions to the plurality of the semiconductor films 14. These $n^+$ type conductive regions 16 are provided at both ends of each of the semiconductor films 14 in the first direction so as to contact at least the first electrode layers 22 at both ends of the strings among the first electrode layers 22 constituting each string. In the present embodiment, the carriers are electrons $e^-$ since the $n^+$ type conductive regions 16 are n type conductive layers.

The low resistance regions 18 are provided at the opposite sides of the regions where the first electrode layers 22 are provided in the plurality of the $n^+$ type conductive regions 16 and are formed by, for example, forming nickel (Ni) silicide in the $n^+$ type conductive regions 16. These low resistance regions 18 are connected to a plurality of bit lines and a plurality of source electrodes, which are described later, and are regions for suppressing the elevation of electric resistance in connections between each of the $n^+$ type conductive regions 16 and the plurality of the bit lines or the plurality of the source electrodes.

The first electrode layers 22 are electrode layers including memory cells and electrodes, and are, for example, cylindrical layers that form metal-oxide-nitride-oxide-silicon (MONOS) layers at regions crossing the semiconductor films 14. These first electrode layers 22 form strings in the first direction and penetrate the insulating films 12 and the semiconductor films 14 in the third direction so as to plurally line these strings in the second direction. In the example in FIG. 1, the plurality of the first electrode layers 22 are arrayed so as to form hexagonal lattices in which each of the first electrode layers 22 make the centers and vertexes of regular hexagons. Note that, although eight first electrode layers 22 in FIG. 1 form one string, the number of the first electrode layers 22 is not limited to this, and, for example, a greater number of the first electrode layers 22, such as 64, 96 and 128, can form one string. Moreover, although the first electrode layers 22 form the hexagonal lattices, the shapes are not limited to this, and the arrays may be disposed to form square lattices. In both cases, the first direction is a string direction, and the second direction is a direction orthogonal to the first direction.

Figure 2A:
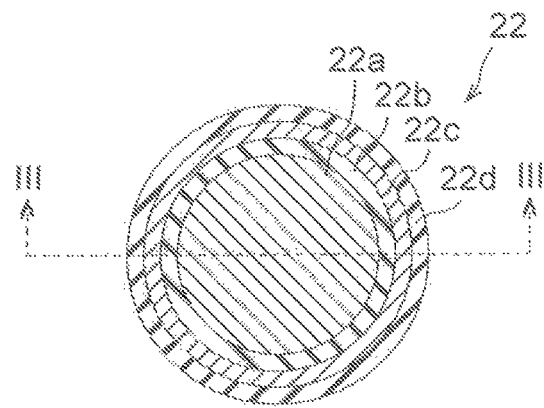
FIGS. 2A and 2B are end views showing an example of electrode layers according to the first embodiment.
Figure 2B:
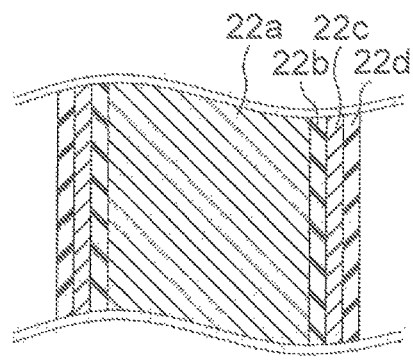

FIG. 2A is a view showing one example of a I-I sectional view of FIG. 1, showing the structure of the first electrode layers 22. In addition, FIG. 2B Is a III-III sectional view of FIG. 2A. As shown in these FIGS. 2A and 2B, each of the first electrode layers 22 includes a first electrode 22a, a first oxide film layer 22b, a nitride film layer 22c and a second oxide film layer 22d. This nitride film layer 22c is formed as a storage part of a memory. The nitride film layer 22c accumulates carriers, thereby enabling each memory cell to retain data.

Thus, each of the first electrode layers 22 is formed to be a cylindrical MONOS film at regions intersecting with the semiconductor films 14. Note that the first electrode 22a may be of polysilicon instead of metal, and the first oxide film layer 22b, the nitride film layer 22c and the second oxide film layer 22d may also have different structures as long as a memory cell can retain the carriers. That is, each of the first electrode layers 22 may be a polysilicon-oxide-nitride-oxide-silicon (SONOS) layer or may have a different structure which exhibits the same functions.

As one example, the first oxide film layer 22b is an electron tunneling insulating film of $SiO_2$, the nitride film layer 22c is a silicon nitride ($Si_3N_4$) film for trapping electrons, and the second oxide film layer 22d is a block insulating film for suppressing the electron tunneling of $SiO_2$. In addition, for example, n type or p type polysilicon or metal such as tungsten (W) forms the first electrode 22a.

Figure 3:
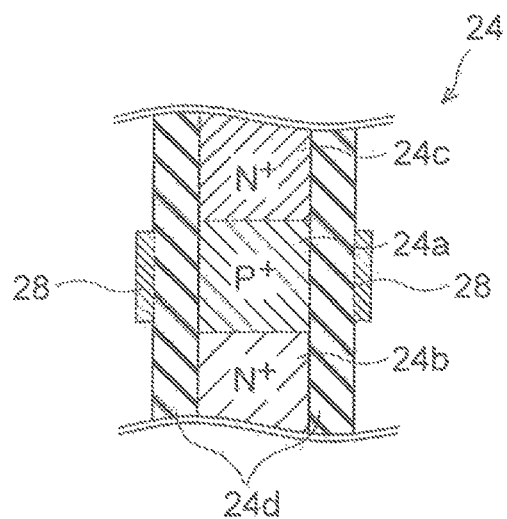
FIG. 3 is an end view showing an example of a transistor according to the first embodiment.

Going back to FIG. 1, the transistors 24 are transistors for controlling a voltage applied to the first electrodes 22a and are, for example, cylindrical metal-oxide-semiconductor field effect transistors (MOSFET) in which the sources thereof and the first electrodes 22a are electrically connected. FIG. 3 is a view showing one example of a II-II sectional view of FIG. 1, showing the structure of the transistors 24. As shown in this FIG. 3, each of the transistors 24 is a vertical n type MOSFET and configured by including a channel region 24a, a source region 24b, a drain region 24c and an insulating film 24d. In addition, the second conducting wirings 28 correspond to gate electrodes.

The channel region 24a is, for example, a $p^+$ type conductive layer and faces the second conducting wiring 28, the gate electrode, through the insulating film 24d. By applying a voltage to the second conducting wiring 28, a depletion layer and a channel layer are formed in the channel region 24a.

The source region 24b and the drain region 24c are, for example, $n^+$ type conductive layers formed to interpose the channel region 24a therebetween. By a voltage applied to the drain region 24c, a drain current flows from the drain region 24c to the source region 24b. The insulating film 24d is a so-called gate insulating film in the MOSFET, is a film of an insulant for insulating between the second conducting wiring 28, the gate electrode, and the channel region 24a, the source region 24b and the drain region 24c, and is formed by, for example, $SiO_2$.

Going back to FIG. 1 again, the first conducting wirings 26 are conducting wirings for applying a voltage to the plurality of the first electrodes 22a through the plurality of the transistors 24, and are so-called word lines. These first conducting wirings 26 are formed along the first direction so as to be electrically connected to the drain regions 24c of the plurality of the transistors 24 along the first direction. That is, the plurality of the first conducting wirings 26, which corresponds to the number of the strings, are formed along each of the string so as to be connected to the plurality of the first electrodes 22a forming each of the strings.

The second conducting wirings 28 are conducting wirings constituting the gate electrodes of the plurality of the transistors 24 along the second direction and function as the gate electrodes of the transistors 24 along the second direction. As shown in FIG. 3, each of the second conducting wiring 28 is formed at a position where a voltage can be applied to the channel region 24a of the transistor 24. That is, the second conducting wirings 28 are formed between the first conducting wirings 26 and the semiconductor film 14 in a direction orthogonal to the first conducting wirings 26.

Figure 4:
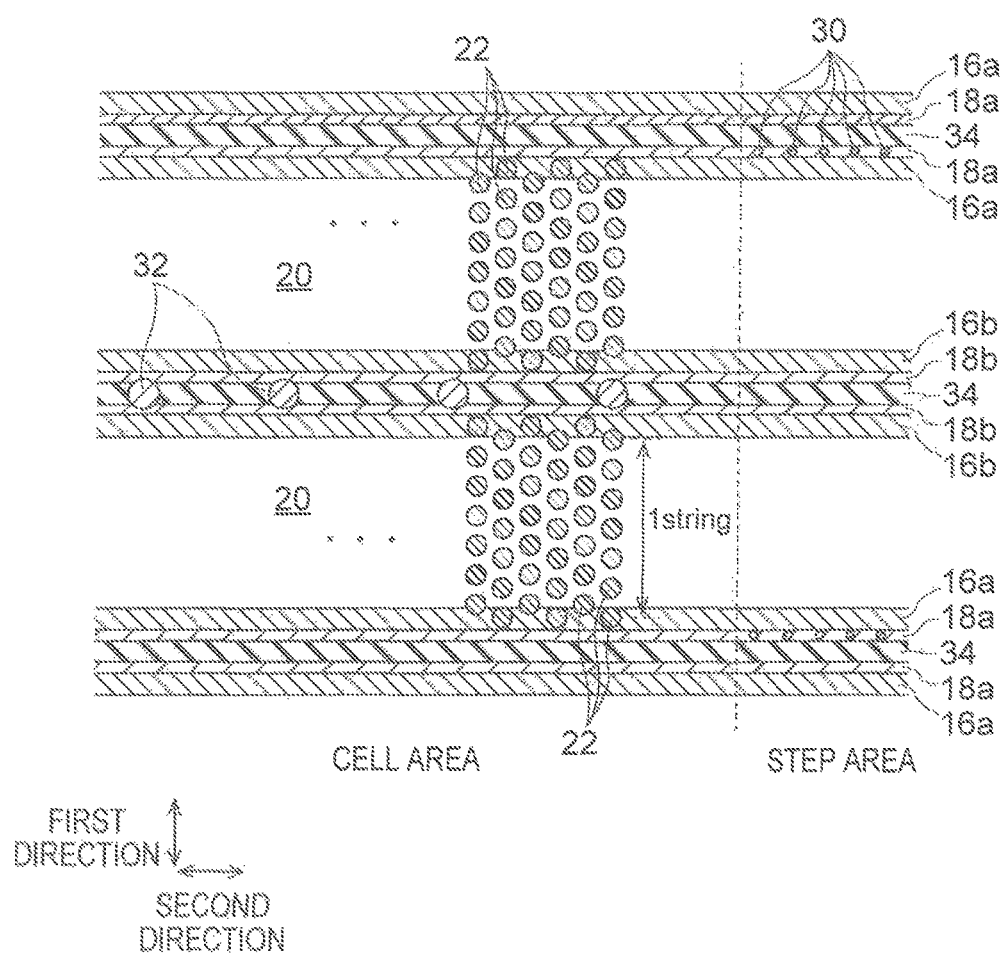
FIG. 4 is a plan view schematically showing a simple overview of the semiconductor device according to the first embodiment.

The entire configuration of the semiconductor device 1 has been described above. Next, the entire layout thereof will be described. FIG. 4 is a plan view that shows a part of the semiconductor device 1 on the semiconductor layer 20 and is a plan view that shows the dispositions of the first electrode layers 22 in the semiconductor layer 20. Note that the illustrations of various conducting wirings and the like are omitted in this FIG. 4 to explain the first electrode layers 22 and each of the regions.

As shown in FIG. 4, in a planar view of the semiconductor layer 20, the semiconductor device 1 is roughly divided into cell areas and step areas and includes a plurality of contacts 30, a plurality of source electrodes 32 and a plurality of region separation films 34, in addition to the aforementioned components. In addition, the $n^+$ type conductive regions 16 and the low resistance regions 18 near the contacts 30 are referred to as first $n^+$ type conductive regions 16a and first low resistance regions 18a, respectively, and those at the opposite side, near the source electrodes 32, are referred to as second $n^+$ type conductive regions 16b and second low resistance regions 18b, respectively.

The contacts 30 are contacts for electrically connecting the bit lines and the first $n^+$ type conductive regions 16a through the first low resistance regions 18a, and are formed in the step areas so as to penetrate the insulating films 12 in the third direction. Each of the contacts 30 is selectively connected to one of the first low resistance regions 18a and is not connected to a plurality of other first low resistance regions 18a. As described later, to connect each of the contacts 30 and a certain one of the first low resistance regions 18a, connection parts between the contact 30 and each of the first low resistance regions 18a are formed stepwise along the second direction so as to descend from the cell area to the substrate 10 in the third direction.

The source electrodes 32 are electrodes electrically connected to each of the second $n^+$ type conductive regions 16b through each of the second low resistance regions 18b and are provided so as to penetrate the semiconductor layer 20 in the third direction. By applying a voltage selectively to the bit lines in a state where a voltage is being applied to these source electrodes 32, data can be read and written in the selected memory cell. Note that, as shown in FIG. 4, the source electrodes 32 may be common to the adjacent cell areas.

Summing up the description above, it is possible to select a string by the second conducting wirings 28 in FIG. 1, select a semiconductor film 14 by the bit lines, and access an arbitrary memory cell by the first conducting wirings 26. That is, each string is formed so as to act as a transistor in which the first low resistance regions 18a serve as the drain regions, the semiconductor films 14 serve as the channel regions, the second low resistance regions 18b serve as the source regions and the first electrode layers 22 serve as the gate electrodes.

The region separation films 34 are layers made of an insulant for electrically splitting each of the cell areas and each of the step areas from each other and are provided between each of the cell areas and between each of the step areas along the second direction so as to penetrate the semiconductor layer 20 in the third direction. By these region separation films 34, insulation occurs between each of the cell areas, and, at the same timing, it is possible to select and access a plurality of memory cells belonging to different cell areas.

Figure 5A:
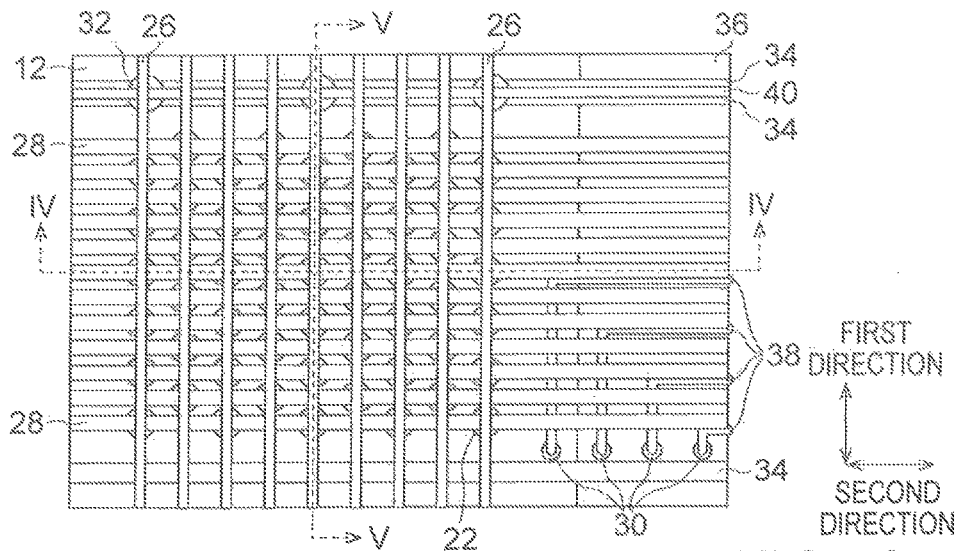
FIGS. 5A to 5C are a plan view of the semiconductor device according to the first embodiment and end views showing the front and left side thereof.
Figure 5B:
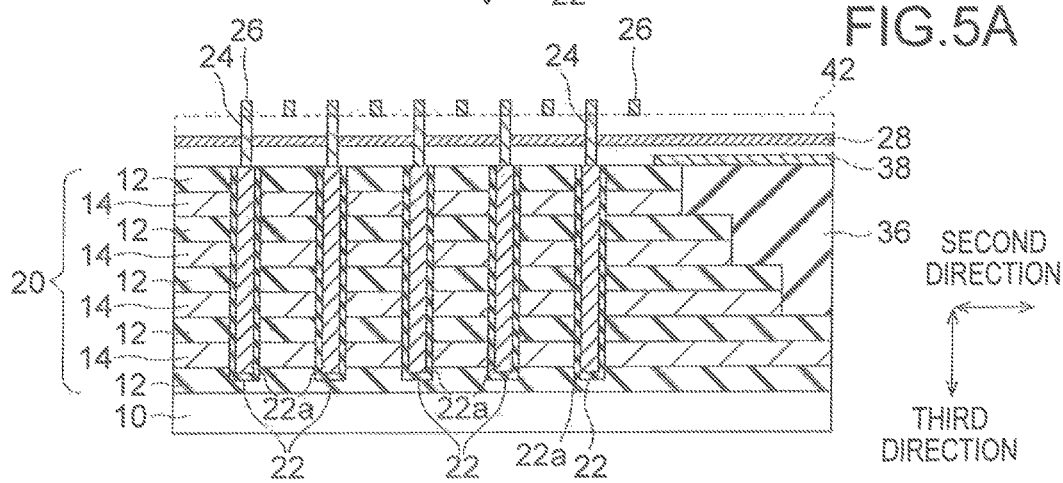

Next, the configuration including wirings and the like will be detailed. FIG. 5A is a plan view of the semiconductor device 1. In addition, FIG. 5B is an end view of IV-IV shown in FIG. 5A and a front end view of the semiconductor device 1 from the first direction. Note that, for explanation, an interlayer insulating film 42 indicated by a broken line above the semiconductor layer 20 in FIG. 5B is not illustrated in FIG. 5A.

As shown in this FIG. 5A, above the semiconductor layer 20, the semiconductor device 1 includes the plurality of the first electrode layers 22, the plurality of the first conducting wirings 26, the plurality of the second conducting wirings 28, the plurality of the contacts 30, the plurality of the source electrodes 32, the plurality of the region separation films 34, a step forming interlayer film 36, a plurality of bit lines 38 and a plurality of source lines 40. Note that, for explanation, the details of the layered parts of the first electrode layers 22 are not illustrated in the plan view hereinafter.

As shown in FIGS. 5A and 5B, the step forming interlayer film 36 is an insulating film formed stepwise so as to not to electrically connect each of the contacts 30 and the plurality of the first low resistance regions 18a other than each of the first low resistance regions 18a to which each of the contacts 30 is connected. To form step formation, this step forming interlayer film 36 is formed so as to be stepwise in the step areas of the semiconductor layer 20, sequentially descending from the region, which is adjacent to the cell area, along the second direction and in the third direction toward the substrate 10. Each of the contacts 30 penetrates this step forming interlayer film 36 and the insulating films 12 facing the step formation and is connected to the semiconductor films 14 facing directly under these insulating films 12.

The bit lines 38 are conducting wirings for applying a voltage to the first n$^+$ type conductive regions 16a through the first low resistance regions 18a and the contacts 30 and are formed on the semiconductor layer 20 so as to be connected to the contacts 30. The source lines 40 are conducting wirings for applying a voltage to the source electrodes 32 and formed along the second direction on the region separation films 34, which contact the second low resistance regions 18b, so as to be connected to the plurality of the source electrodes 32.

As indicated by the broken line in FIG. 5B, the interlayer insulating film 42 omitted and not illustrated in FIG. 5A is made of an insulant and formed on the semiconductor layer 20 so as to insulate each of the electrodes, between the conducting wirings, and the like. Note that the illustration of the detailed structure of the transistors 24 is omitted in the front end view and the side end view hereinafter.

As shown in FIG. 5B, the plurality of the insulating films 12 and the plurality of the semiconductor films 14 are alternately laminated on the substrate 10 and form the semiconductor layer 20. The first electrode layers 22 are formed so as to be cylindrical with the first electrodes 22a in the centers thereof and penetrate the insulating films 12 and the semiconductor films 14 in the third direction. The transistors 24 are formed on the first electrode layers 22 so that the source regions 24b of the transistors 24 are electrically connected to the first electrodes 22a.

As shown in this FIG. 5B, the step forming interlayer film 36 faces, in the third direction, the insulating films 12 of the upper surfaces of the step formation and faces, in the second direction, the insulating films 12 and the semiconductor films 14 of the side surfaces of the step formation. The bit lines 38 are formed on the semiconductor layer 20, in which this step forming interlayer film 36 is formed, so as to be connected to the contacts 30. The interlayer insulating film 42 fixes these wirings.

Figure 5C:
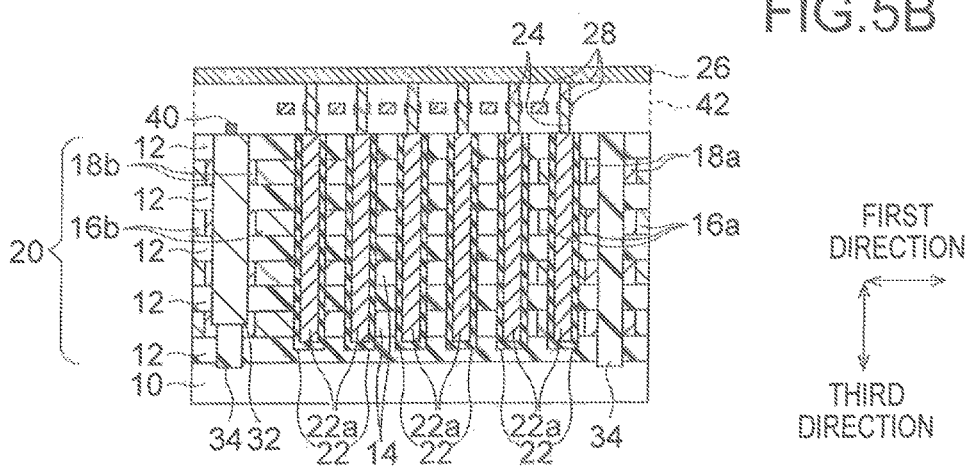

FIG. 5C is an end view of V-V shown in FIG. 5A and a side end view of the semiconductor device 1 from the second direction.

The first n$^+$ type conductive regions 16a and the second n$^+$ type conductive regions 16b are formed at both ends of the semiconductor films 14 in the first direction so as to contact the first electrode layers 22, which constitute the strings and are positioned at both ends, among the plurality of the first electrode layers 22. In addition, the first low resistance regions 18a and the second low resistance regions 18b are formed at sides opposite to that the first electrode layers 22 are formed in these n$^+$ type conductive regions 16, so as to contact the region separation films 34 and the source electrodes 32.

The source electrodes 32 are formed in the region separation films 34 and the semiconductor layer 20 so as to short the second low resistance regions 18b in the two adjacent cell areas from each other. The region separation films 34 are formed trenched so as to divide the regions in which arrays of each of the first electrode layers 22 are formed, except the regions in which the source electrodes 32 are formed. That is, the region separations films 34 are electrically connected to the adjacent regions through the source electrodes 32 near the source electrodes 32 and are separated from the adjacent regions near the contacts 30.

Figure 6:
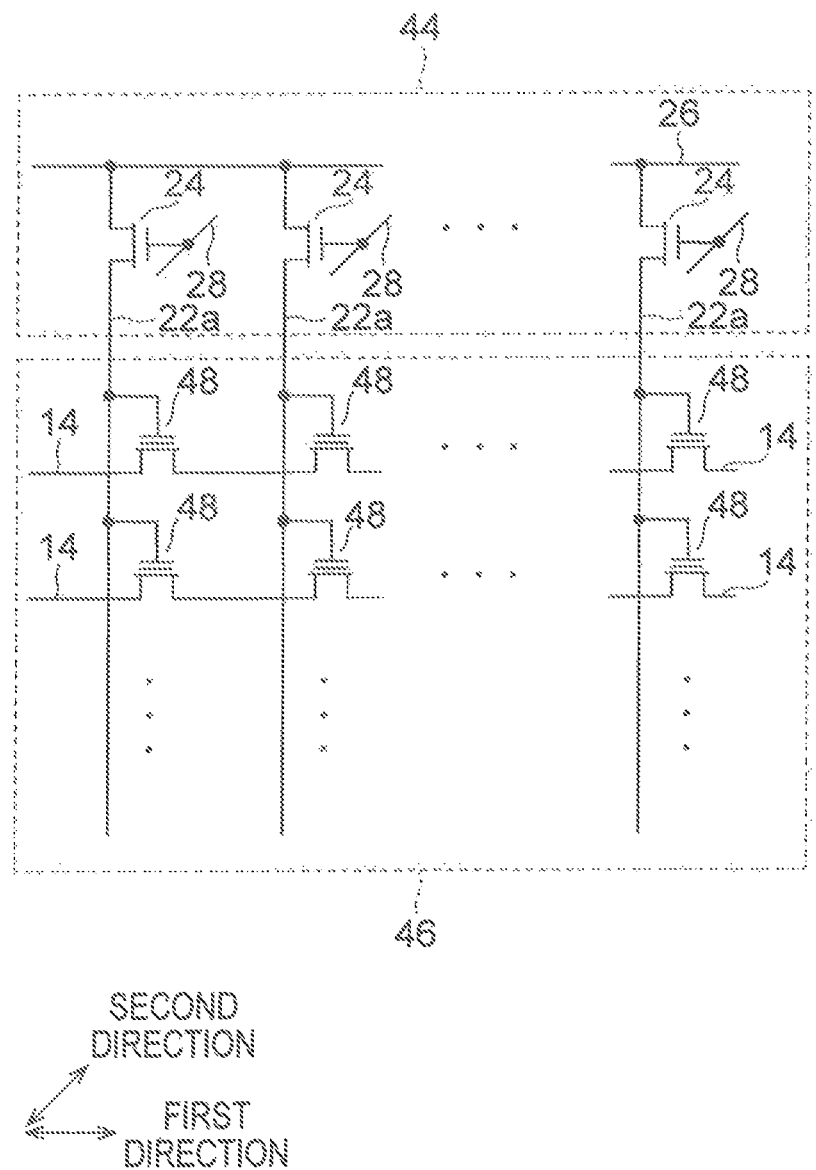
FIG. 6 is a circuit diagram at the front section of the semiconductor device according to the first embodiment.

Next, a circuit for the strings of the semiconductor device 1 according to the present embodiment, that is, a circuit at the end surface of FIG. 5C will be described. FIG. 6 is a circuit diagram schematically showing a circuit in the strings of the semiconductor device 1 in FIG. 5C.

The circuit of the semiconductor device 1 according to the present embodiment includes a string selecting circuit 44 and a memory cell circuit 46. The string selecting circuit 44 is a circuit corresponding to the structure positioned above the semiconductor layer 20, and the memory cell circuit 46 is a circuit corresponding to the structure positioned inside the semiconductor layer 20.

The string selecting circuit 44 is a circuit including the transistors 24, the first conducting wirings 26 and the second conducting wirings 28 and is a circuit for conducting the string with the selected memory cell. In addition, the memory cell circuit 46 includes memory cells 48 constituted by each of the first electrode layers 22 and the semiconductor films 14 and is a circuit for recording data. These memory cells 48 are formed by MONOS layers formed by the first electrode layers 22 and the semiconductor films 14.

As shown in FIG. 6, the first conducting wirings 26 are connected to the drains of the transistors 24. The second conducting wirings 28 function as the gates of the transistors 24. A voltage is applied to the first electrodes 22a from the sources of the transistors 24. The first electrodes 22a are connected to gates of the memory cells 48, and data in the memory cells 48 are accessed by the voltage applied to these gates and the voltage applied to the semiconductor films 14.

Next, a manufacturing process of the semiconductor device 1 according to the present embodiment will be described. Note that, unless otherwise stated, FIG. xA is a plan view, FIG. xB is a IV-IV end view of FIG. xA, that is, a front end view seen from the first direction, and FIG. xC is a V-V end view of FIG. xA, that is, a left side end view seen from the second direction.

Figure 7A:
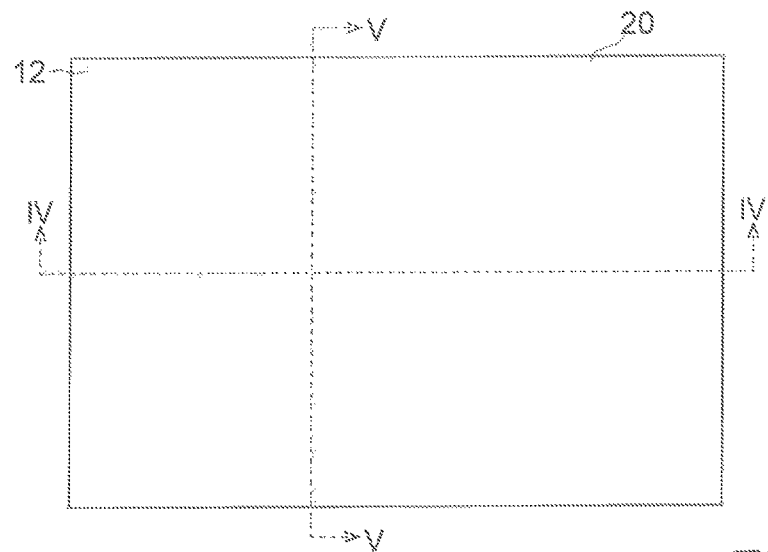
FIGS. 7A to 16C are views showing a manufacturing process of the semiconductor device according to the first embodiment.
Figure 7B:
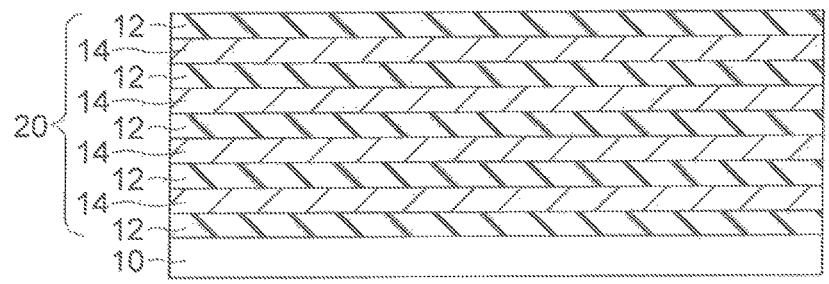
Figure 7C:
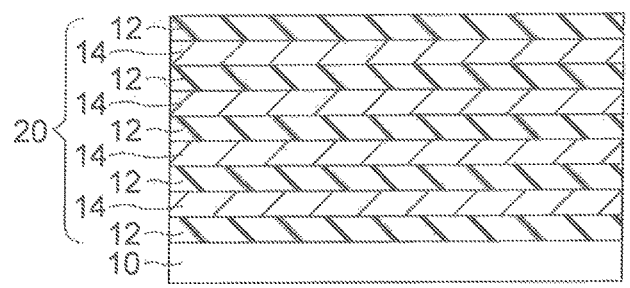

First, the semiconductor layer 20 is formed on the substrate 10 by the plurality of the insulating films 12 and the plurality of the semiconductor films 14. FIGS. 7A to 7C are view showing a process for forming the semiconductor layer 20 by alternately laminating the plurality of the insulating films 12 and the plurality of the semiconductor films 14. As one example, the substrate 10 is a Si substrate, the insulating films 12 as the interlayer films are formed by $SiO_2$ and the semiconductor films 14 as the channel layers are formed by Poly-Si. The insulating films 12 and the semiconductor films 14 are formed by a common deposition method, for example, a chemical vapor deposition (CVD) method. The thicknesses of both the insulating films 12 and the semiconductor films 14 are designed to be a maximum of several 10 nm.

Figure 8A:
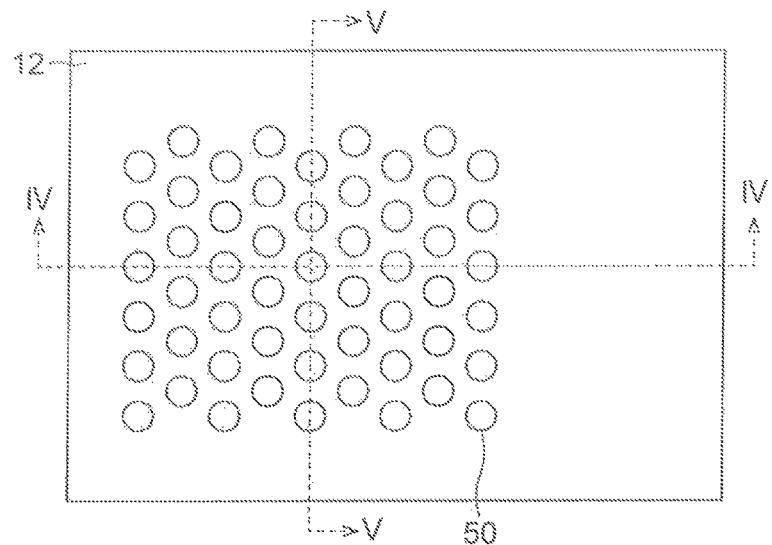
Figure 8B:
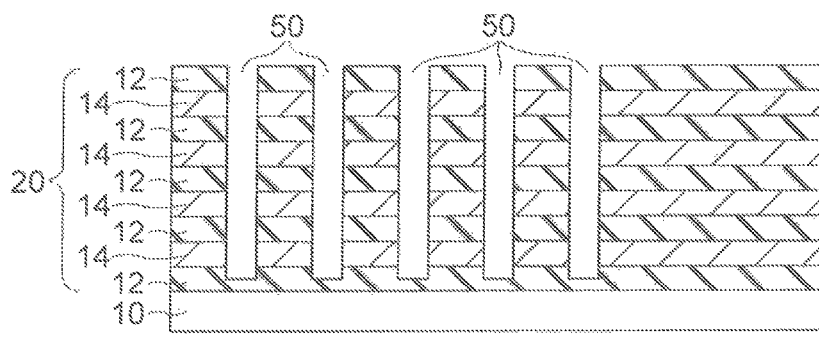
Figure 8C:
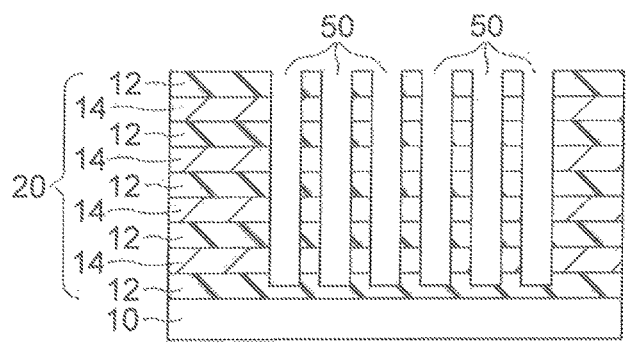

Next, holes (memory holes) for embedding the gate electrodes are opened in the semiconductor films 14, the channel layers. FIGS. 8A to 8C are views showing a process of opening the memory holes. As shown in FIG. 8A, in a planar view, memory holes 50 are formed so as to be arrayed in the first direction and the second direction. In the present embodiment, the memory holes 50 are disposed, for example, in hexagonal lattices so as to be centers and vertexes of regular hexagons.

As shown in FIGS. 8B and 8C, the memory holes 50 are formed in the semiconductor layer 20 so as to penetrate the insulating films 12 and the semiconductor films 14 in the third direction. At this time, along the third direction, the memory holes 50 penetrate the semiconductor film 14 proximate to the substrate 10, but do not penetrate the insulating film 12 contacting the substrate 10. That is, the memory holes 50 are formed so that the first electrodes 22a, which are formed by a process described later, reach the semiconductor film 14 used as memory cells, but do not reach the substrate 10.

In the present embodiment, the semiconductor films 14, including the one proximate to the substrate 10, are used as memory cells, but are not limited to this. It is considered that the semiconductor film 14 proximate to the substrate 10 may not be used as memory cells. In this case, the memory holes 50 should be formed so as to penetrate the semiconductor film 14 proximate to the substrate 10 among the semiconductor films 14 used as memory cells.

Figure 9A:
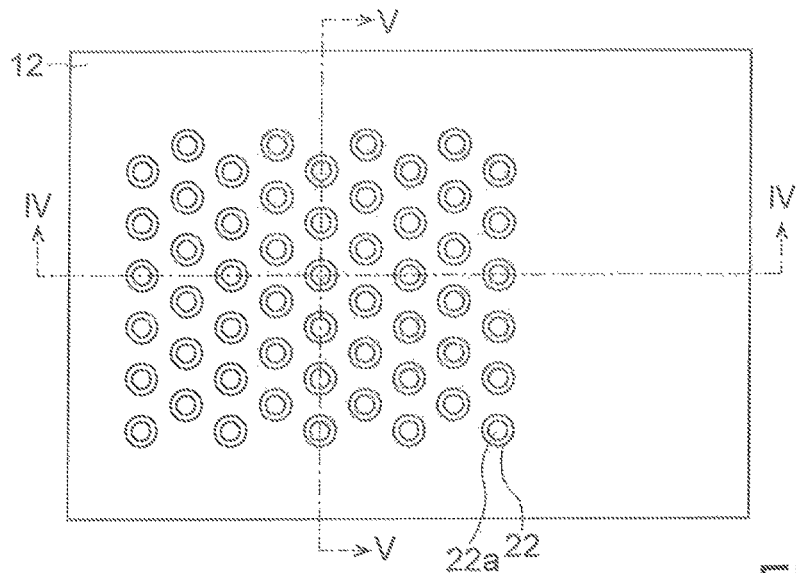
Figure 9B:
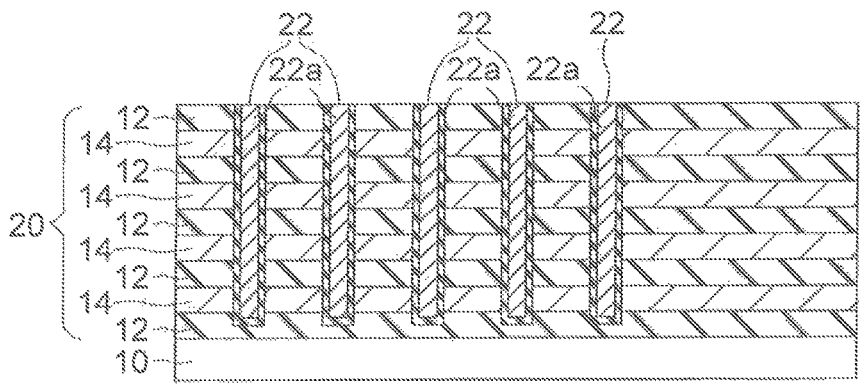
Figure 9C:
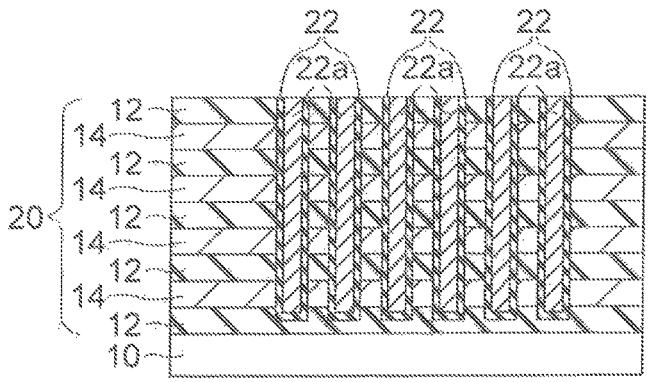

Next, the electrodes and the memory cells are formed inside the memory holes 50 formed as described above. FIGS. 9A to 9C are views showing a process of forming the memory cells. As one example, in each of the memory holes 50, a gate insulating layer of $SiO_2$ is formed, a data storage layer of $Si_3N_4$ is subsequently formed, and, moreover, a block insulating layer of $SiO_2$ is formed so as not to fill the memory hole 50. Finally, a metal such as W or polysilicon, which forms the first electrodes 22a, is formed in the center of each of the memory holes. In this way, the columnar first electrode layers 22, in which the center regions thereof become the first electrodes 22a and which constitute the memory cell arrays, are formed.

Figure 10A:
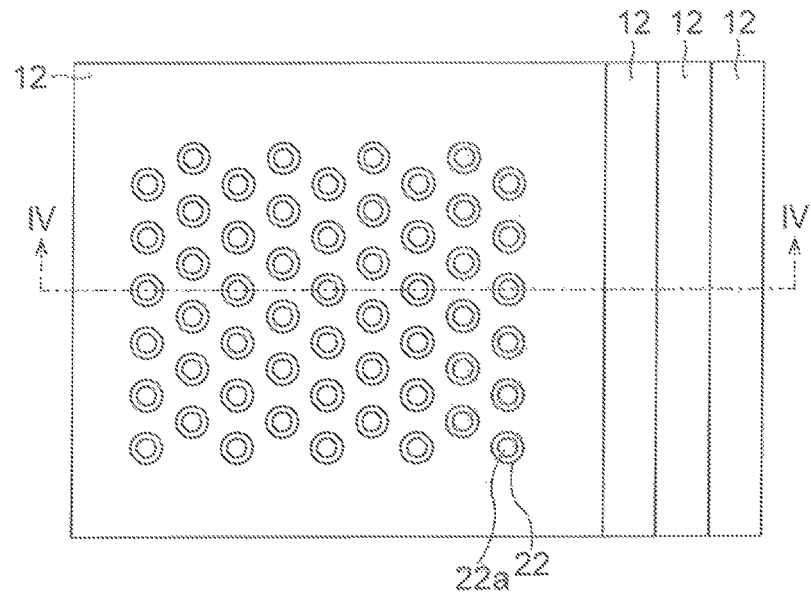
Figure 10B:
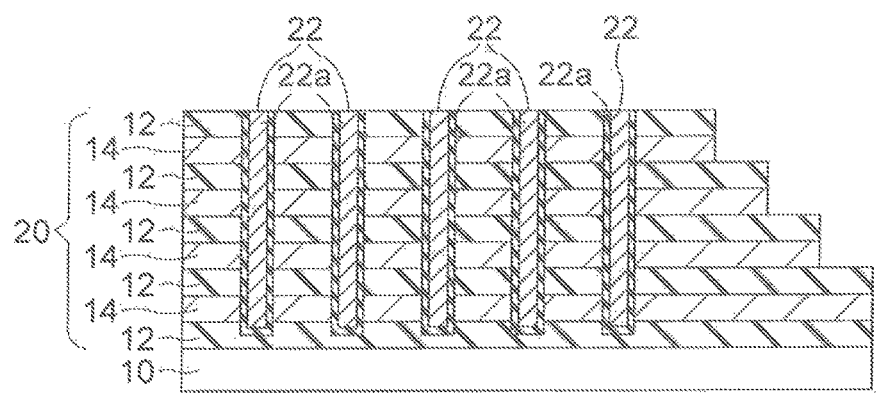

Next, to form the stepwise interlayer film in the step areas at one end In the second direction, the semiconductor layer 20 is etched stepwise. FIGS. 10A and 10B are views showing this etching process. As shown in FIGS. 10A and 10B, step formation is formed by etching the plurality of the insulating films 12 and the plurality of the semiconductor films 14. This step formation forming process can be performed by a process, for example, in which etching is performed after masking to thin (slim) the masks and further etching is performed.

By this process, a stepwise space is formed in the step areas of the semiconductor layer 20 as shown in FIG. 10B. The insulating films 12 are revealed at the upper surfaces of the stepwise space, and the insulating films 12 and the semiconductor films 14 are revealed at the side surfaces in the second direction.

Figure 11A:
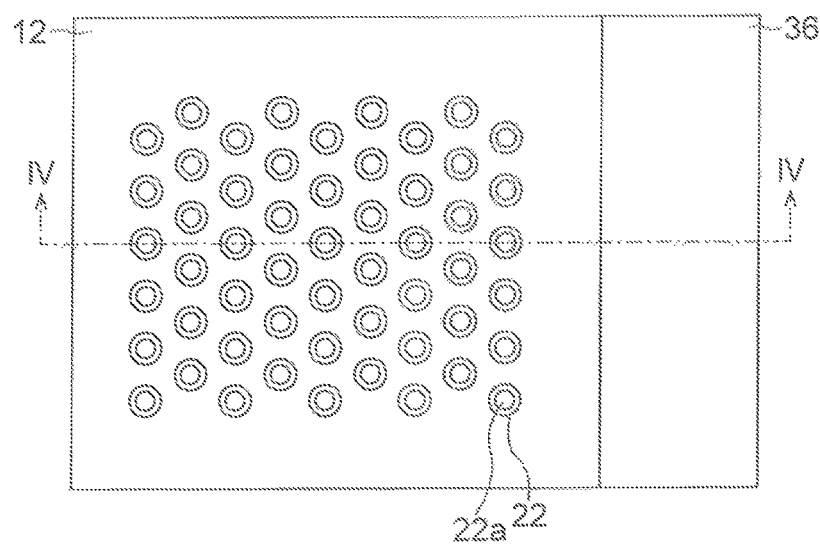
Figure 11B:
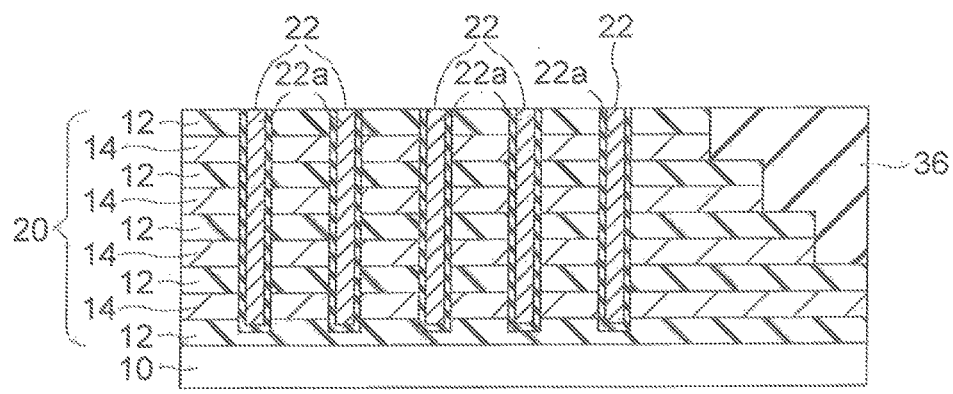

Next, the interlayer film of an insulant is formed in the stepwise space formed as described above. FIGS. 11A and 11B are views showing a process of forming the stepwise interlayer film. As shown in FIGS. 11A and 11B, the step forming interlayer film 36 is formed by depositing an insulant such as $SiO_2$ in the stepwise space formed in the previous process. The deposition of the insulant is performed by, for example, flattening after using CVD.

Figure 12A:
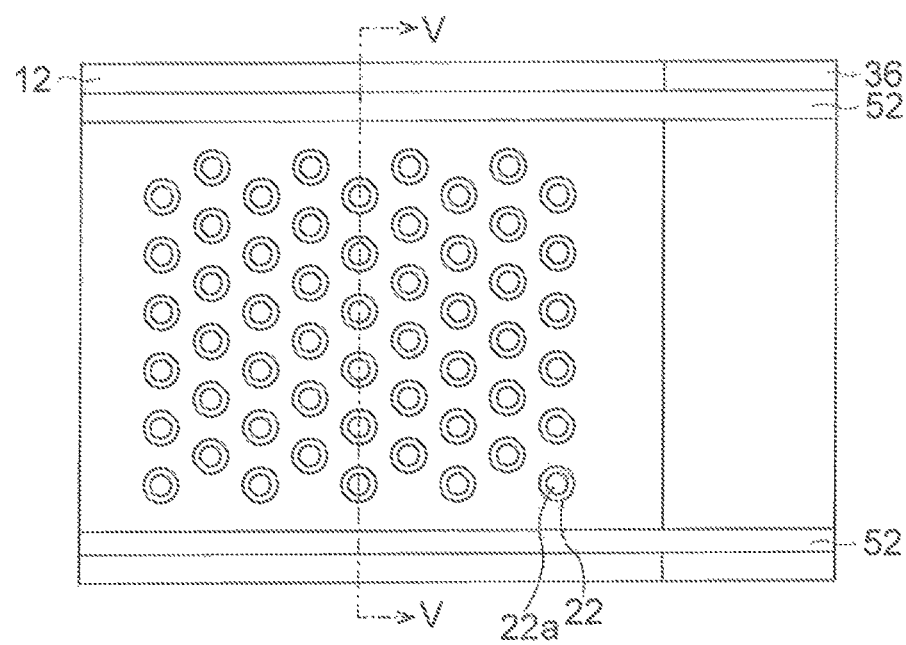
Figure 12B:
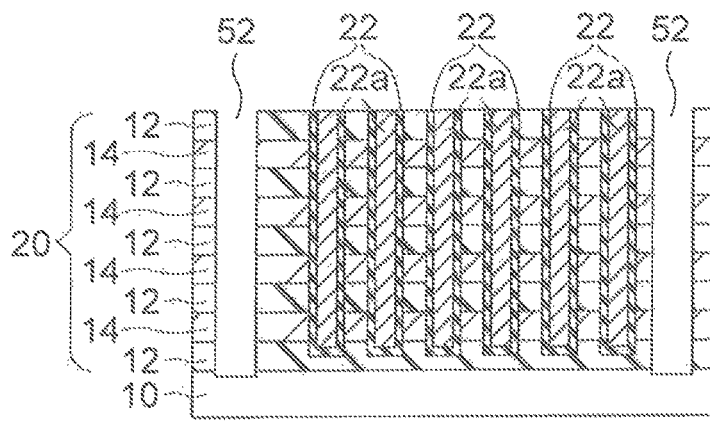

Next, splitting trenches for splitting the cell areas from each other are formed along the second direction. FIGS. 12A and 12B are views showing a process of forming the splitting trenches. As shown in FIG. 12A, in the process, trenches 52 along the second direction are opened at both ends of the plurality of the first electrode layers 22, which form the plurality of the string in the cell areas, so as not to contact the first electrode layers 22.

FIG. 12B is a V-V end view in FIG 12A, that is, a left side end view seen from the second direction. As shown in this FIG. 12B, these trenches 52 are formed so as to penetrate the plurality of the insulating films 12 and the plurality of the semiconductor films 14 in the third direction. At this time, unlike the first electrode layers 22, the trenches 52 may penetrate the insulating film 12 facing the substrate 10. The trenches 52 are formed so as to penetrate at least the semiconductor film 14 which is proximate to the substrate 10 and used as the channel layer.

Figure 13A:
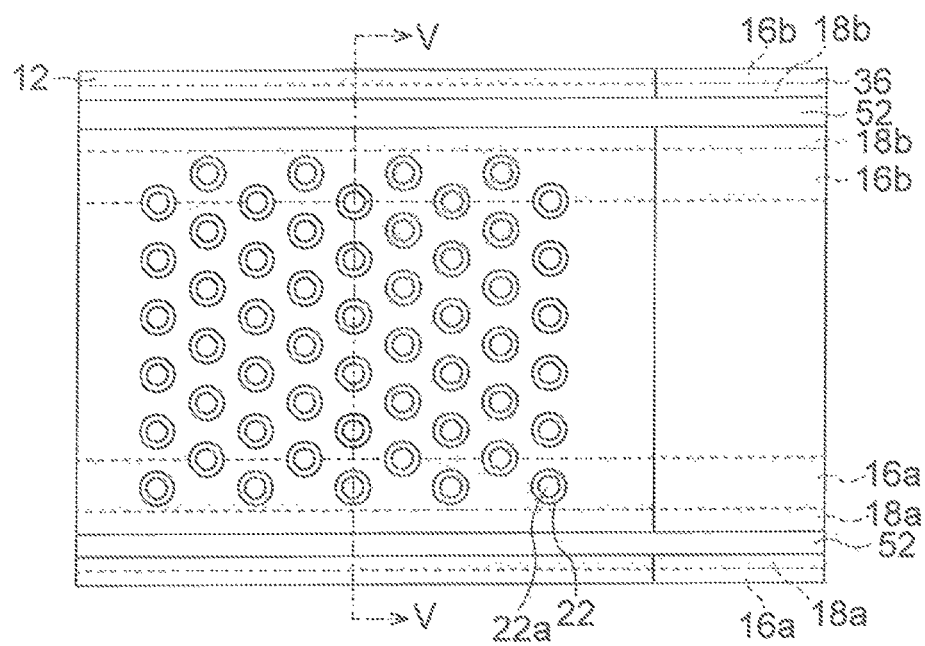
Figure 13B:
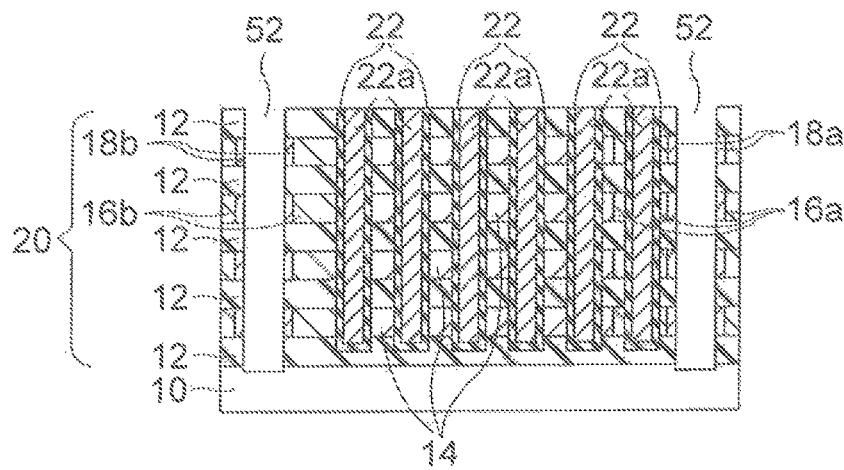

Next, the $n^+$ type conductive regions 16 and the low resistance regions 18 are formed. FIGS. 13A and 13B are views showing a process of forming these $n^+$ type conductive regions 16 and low resistance regions 18. First, the $n^+$ type conductive regions 16 are formed at each of the semiconductor films 14, the channel layers exposed at sides of the trenches 52. For example, P ions are diffused by a vapor phase diffusion technique to form $n^+$ type diffusion regions at regions in each semiconductor films 14 facing the trenches 52. As shown in FIG. 13A, these $n^+$ type conductive regions 16 are formed so as to reach at least one of the first electrode layers 22 at both ends of the first electrode layers 22 constituting the strings.

After the $n^+$ type conductive regions 16 are formed, the low resistance regions 18 are subsequently formed in the $n^+$ type conductive regions 16 along the trenches 52. For example, the low resistance regions 18 are formed as follows: Ni is embedded by a CVD method or the like in the trenches 52 in which the $n^+$ type conductive regions 16 are formed; heat treatment is performed to cause thermal reaction between the $n^+$ type conductive regions 16 and Ni to form Ni silicide; and unreacted Ni are selectively removed by chemical liquid. Note that the low resistance regions 18 can also be formed by recessing the $n^+$ type conductive regions 16 facing the trenches 52 and embedding metal.

Figure 14A:
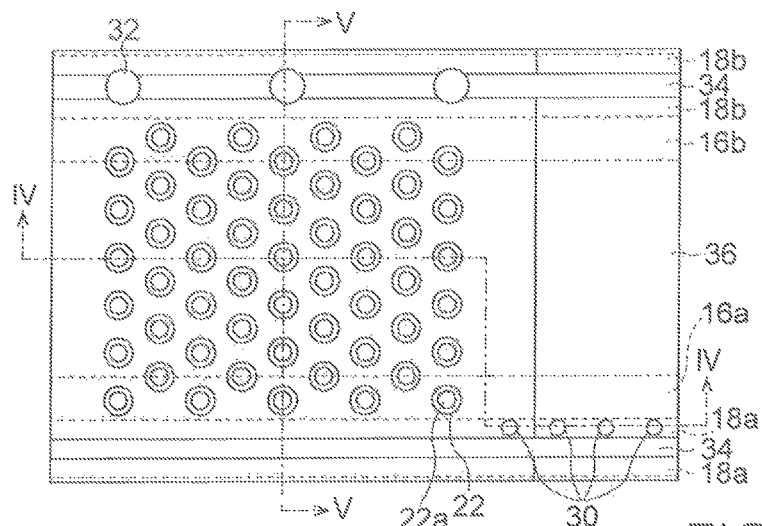
Figure 14B:
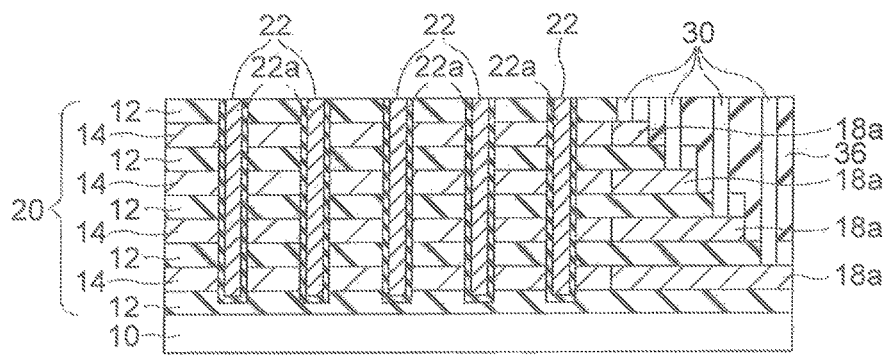
Figure 14C:
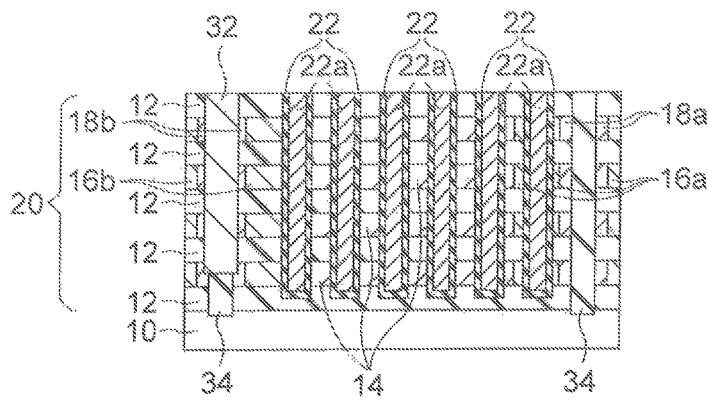

FIG. 13B is a V-V end view in FIG 13A, that is, a left side end view seen from the second direction. As shown in this FIG. 13B, the $n^+$ type conductive regions 16 and the low resistance regions 18 are formed selectively at the semiconductor films 14 of the semiconductor layer 20. Note that, hereinafter, the low resistance regions 18, to which the contacts 30 are connected, and the $n^+$ type conductive regions 16, which are adjacent to these low resistance regions 18, are referred to as the first low resistance regions 18a and the first $n^+$ type conductive regions 16a, respectively. Other low resistance regions 18 and $n^+$ type conductive regions 16, which are near the source electrodes positioned at the opposite side of the strings, are referred to as the second low resistance regions 18b and the second n⁺ type conductive regions 16b, respectively. Next, conductors connected to each of the low resistance regions 18 are formed. FIGS. 14A to 14C show a process of forming the contacts 30 and the source electrodes 32. As shown in FIG. 14A, first, the region separation films 34 are formed by forming an insulant in the trenches 52. The region separation films 34 are formed by using, for example, a common deposition method of an insulant, such as a CVD method.

After the region separation films 34 are formed, the contacts 30 and the source electrodes 32 are formed. As shown in FIG. 14A, the contacts 30 are formed in the step regions so as to be connected to each of the first low resistance regions 18a. FIG. 14B is an end view of IV-IV shown in FIG. 14A, that is, a front end view showing the end surface along the first electrode layers 22 in the cell areas and the end surface along the contacts 30 in the step areas.

As shown in this FIG. 14B, each of the contacts 30 is connected to each of the first low resistance regions 18a sequentially from the ones closer to the cell areas so as to be electrically connected to the semiconductor films 14 at the upper parts of the steps. By forming stepwise regions for connecting the first low resistance regions 18a and the contacts 30, each of the contacts 30 is formed so as to be connected to the first low resistance region 18a to which each of the contacts 30 should be connected, but not to be connected to other first low resistance regions 18a.

Going back to FIG. 14A, the source electrodes 32 are formed together with forming the contacts 30. The source electrodes 32 are formed in the region separation film 34 at the region which is opposite to the region in which the contacts 30 are formed and interposing the strings between the regions. As shown in FIG. 14C, unlike the contacts 30, the source electrodes 32 may be formed so to be commonly connected to the second low resistance regions 18b in the plurality of semiconductor films 14. Moreover, the source electrodes 32 may also be formed so as to short the second low resistance regions 18b of the cell areas separated from each other through the region separation film 34. Furthermore, as shown in FIG. 14A, the plurality of the source electrodes 32 may also be formed in the same region separation film 34.

Figure 15A:
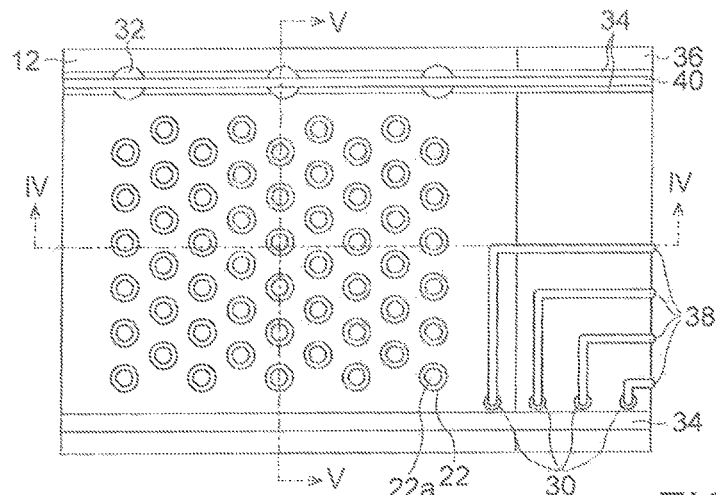
Figure 15B:
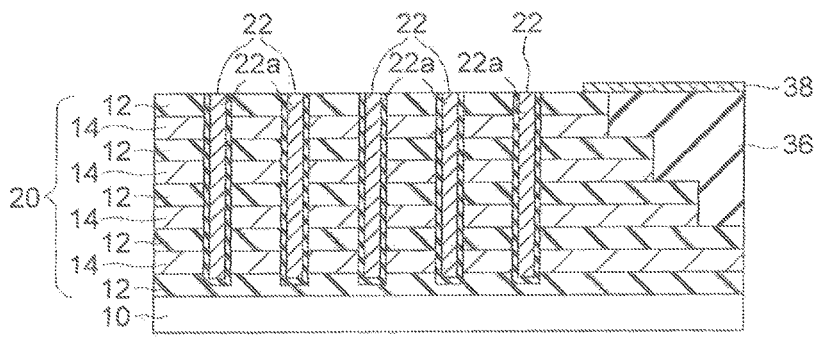
Figure 15C:
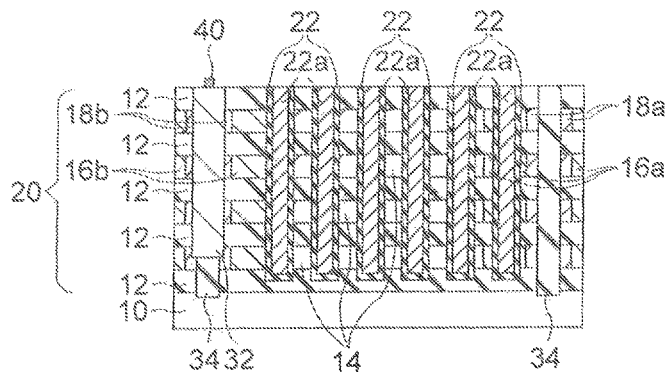

Next, conducting wirings for applying a voltage to the contacts 30 and the source electrodes 32 are formed. FIGS. 15A to 15C are views showing a process of forming these conducting wirings. First, as shown in FIG. 15A, the bit lines 38, which are connected to the contacts, are formed on the insulating film 12 and the step forming interlayer film 36 in the step areas. As previously described, these bit lines 38 are conducting wirings for applying a voltage to the drain electrodes of the strings. Note that the illustrated wirings are one example and may be disposed in any manner as long as the wirings and the electrodes are not shorted to each other. As shown in FIG. 15B, as one example, the bit lines 38 are formed above the insulating film 12 and the step forming interlayer film 36 so as to contact them and are formed so as to be connected to the contacts 30.

Going back to FIG. 15A, the source lines 40 are formed together with forming the bit lines 38. As shown in FIGS. 15A to 15C, the source lines 40 are formed on the region separation film 34, in which the source electrodes 32 are embedded, so as to be connected to the source electrodes 32.

Figure 16A:
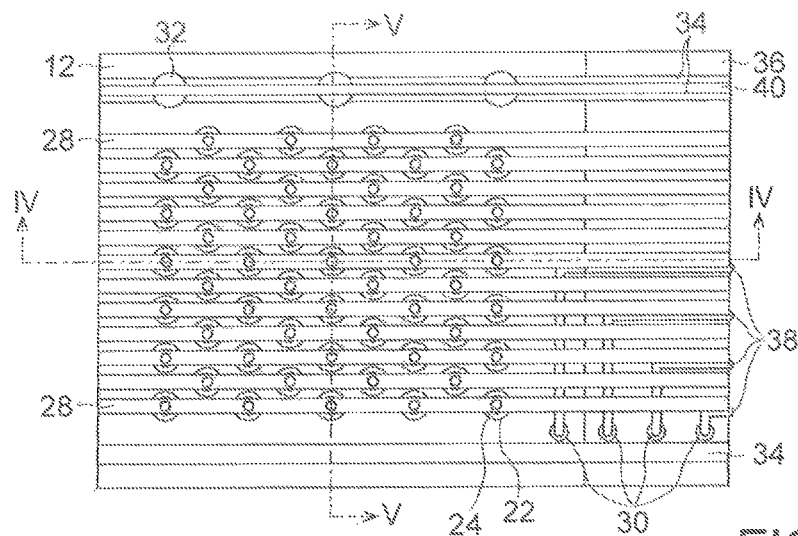
Figure 16B:
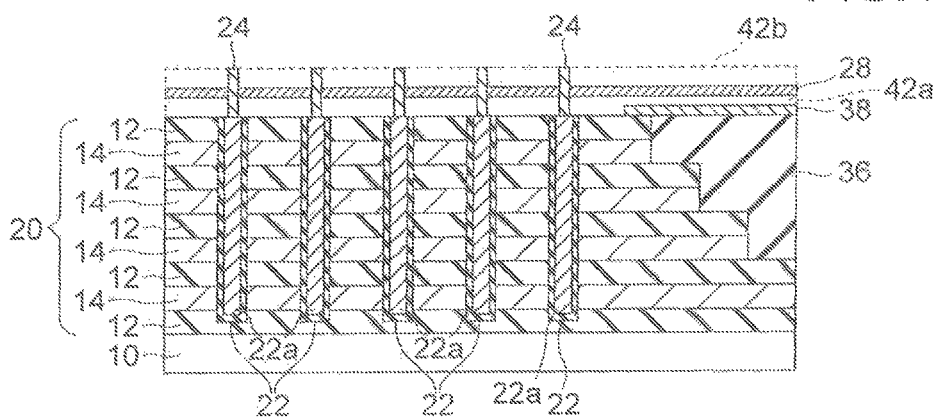
Figure 16C:
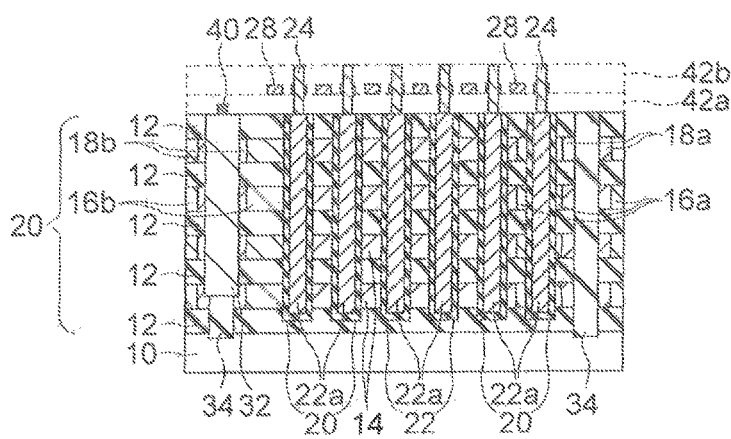

Next, the transistors 24, which are connected to each of the first electrodes 22a, and the second conducting wirings 28, which serve as the gate electrodes of these transistors 24, are formed. FIGS. 16A to 16C are views showing a process of forming the transistors 24 and the second conducting wirings 28. In this process, first, the second conducting wirings 28, which serve as the gate electrodes of the transistors 24, are formed.

As shown in FIGS. 16B and 16C, to form the second conducting wirings 28, an interlayer insulating film 42a, which is a lower part of the interlayer insulating film 42 and a stage for the second conducting wirings 28, is formed on the semiconductor layer 20. This interlayer insulating film 42a is formed by, for example, a CVD method or the like. On this interlayer insulating film 42a, the plurality of the second conducting wirings 28 are formed so as to be positioned on the first electrodes 22a along the second direction.

After the second conducting wirings 28 are formed, an interlayer insulating film 42b, which is an upper part of the interlayer insulating film 42, is formed. After the interlayer insulating film 42 is formed in this way, the transistors 24 are formed. These transistors 24 are formed by opening the holes, which penetrate the second conducting wirings 28 in the third direction, in the interlayer insulating film 42 so as to reach the first electrodes 22a, and by forming films of an insulant at sides the opened holes. As shown in FIG. 3, the n⁺ type conductive layers, p⁺ type conductive layers and n⁺ conductive layers are subsequently formed by sequential depositions. At this time, in the third direction, by making the height of the p⁺ type conductive layers, the channel layers 24a of the transistors 24, and the height of the second conducting wirings 28 substantially the same, the second conducting wirings 28 serve as the gate electrodes.

Next, going back to FIGS. 5A to 5C, the first conducting wirings 26 are formed along the first direction on the interlayer insulating films 42 formed and connected to the source regions 24c of the transistors 24 along the first direction, thereby forming the semiconductor device 1 according to the present embodiment.

Figure 17:
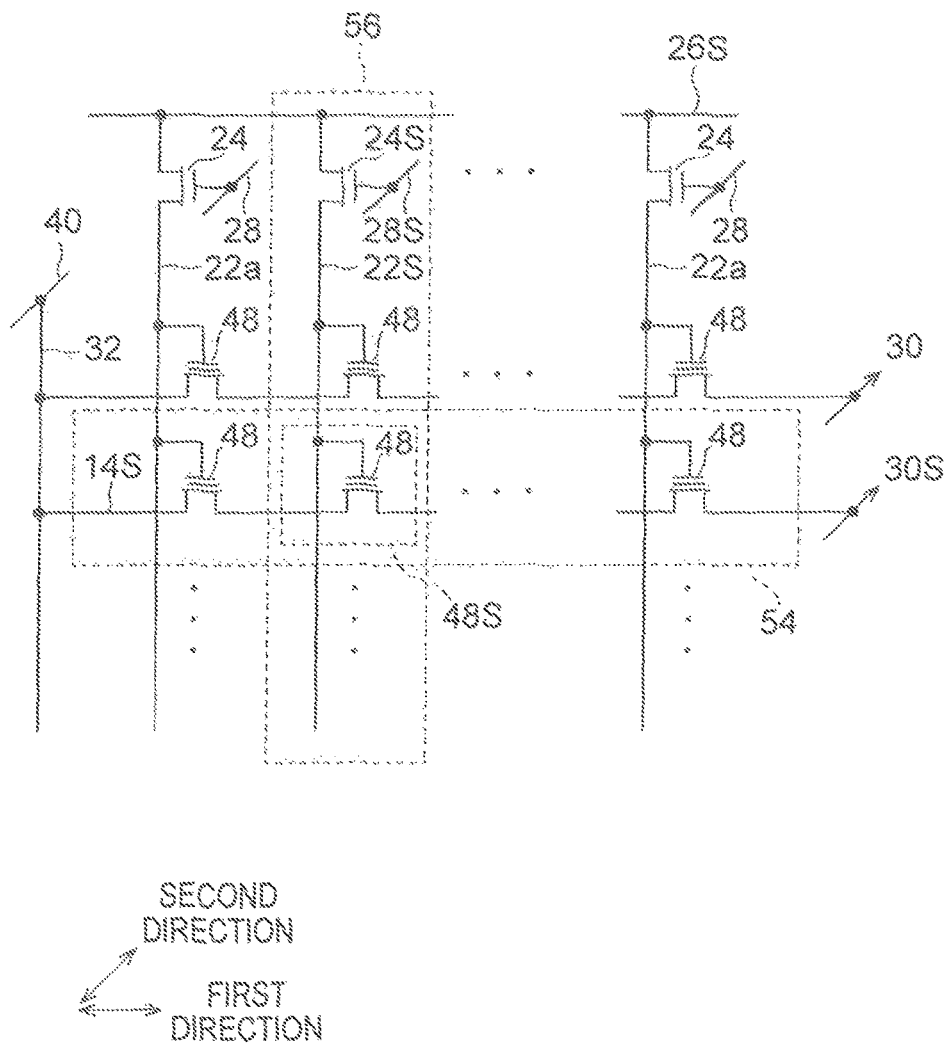
FIG. 17 is a view for explaining the operations of the semiconductor device according to the first embodiment.

Next, the operations of the semiconductor device 1 according to the present embodiment will be described using FIGS. 5A and 17. FIG. 17 is a circuit diagram showing a circuit centering a selected memory cell. An initial state is a state where no voltage is applied in the semiconductor device 1 and nothing is recorded in the memory cells. A selected path 54 is a string to which a selected memory cell 48 (hereinafter, referred to as a selected memory cell 48S) belongs (hereinafter, this string is referred to as a selected string) on a semiconductor film 14 to which the selected memory cell 48S belongs (hereinafter, this semiconductor film 14 is referred to as a selected semiconductor film 14S), and a selected first gate 56 indicates a gate of each of the memory cells 48 formed by a first electrode 22a to which the selected memory cell 48S belongs (hereinafter, this first electrode 22a is referred to as a selected first electrode 22S).

As shown in this FIG. 17, to access data in an arbitrary selected memory cell 48S, the first direction to the third direction are selected as described below. The first direction is selected by a first conducing wiring 26 which applies a voltage to each of the first electrodes 22a forming the selected string (hereinafter, this first conducting wiring 26 is referred to as a selected first conducting wiring 26S). The second direction is selected by a second conducting wiring 28 which applies a voltage to a gate of a transistor 24 connected to the selected first electrode 22S (hereinafter, this second conducting wiring 28 is referred to as a selected second conducting wiring 28S, and this transistor 24 is referred to as a selected transistor 24S). The third direction is selected by a bit line 38 which applies a voltage to a contact 30 connected to the selected semiconductor film 14S (hereinafter, this contact 30 is referred to as a selected contact 30S).

First, as initialization for recording data in a memory cell, each of the semiconductor films 14, the channel layers, is boosted to keep a potential of, for example, a boost voltage $V_{boost}=5$ V. This operation applies the boost voltage $V_{boost}$ to the bit lines 38 and the source lines 40. Thereupon, a voltage higher than the boost voltage $V_{boost}$, for example, a conduction voltage $V_{pass}$ with a voltage of 7 V is applied to the plurality of the first conducting wirings 26 and the plurality of the second conducting wirings 28. By applying the voltages in this way, the semiconductor films 14, the channel layers of each memory cell, are boosted. Each voltage is in a relationship of $V_{pass}>V_{boost}$.

Next, the operation of writing data in the selected memory cell 48S for recording data will be described. First, as a preparation for writing data, a voltage based on the data to be recorded in the selected memory cell 48S is applied between the bit lines 38 and the source lines 40. For example, a source voltage $V_{src}$ of substantially 0 to 2 V is applied to the source lines 40, a data voltage $V_{data}$ of 4 V is applied to the bit lines 38 when "1" is desired to be recorded in the selected memory cell, and a data voltage $V_{data}$ of 0 V is applied to the bit lines 38 when "0" is desired to be recorded. At this time, a voltage lower than the boost voltage $V_{boost}$, for example, a verification voltage $V_{verify}$ of 4 V may be applied to the selected second conducting wiring 28S. In this case, each voltage is in a relationship of $V_{boost}>V_{verify}>V_{src}$.

Depending on either "1" or "0" is recorded as data, the voltage of $V_{data}$ is changed as well as $V_{src}$ is changed, thereby changing the magnitude relationship between these voltages, that is, $V_{src}$ may be a voltage of 0 V or more. By setting $V_{src}$ to a voltage of 0 V or more in this way, the channel of the selected cell near the sources can be cut off.

To write data, for example, a voltage of 20 V may be applied as a writing voltage $V_{pgm}$ to the selected first conducting wiring 26S. Moreover, an On voltage $V_{on+}$ exceeding a threshold voltage $V_{th}$ of the selected transistor 24S is applied to apply a gate voltage, which enables the selected memory cell 48S to trap carriers, to the selected first electrode 22S. Meanwhile, a voltage $V_{on-}$, which is a voltage lower than the threshold voltage $V_{th}$, but capable of generating a depletion layer in the selected semiconductor film 14S to conduct the selected path 54, is applied to the plurality of the second conducting wirings 28, which are the gate electrodes of the plurality of the transistors 24 connected to the plurality of the first electrodes 22a other than the selected first electrode 22S forming the selected string. In this way, for example, the writing voltage $V_{pgm}$ is applied to the selected first electrode 22S, and a buffer voltage $V_{buffer}$ of around 10 V is applied to the first electrodes 22a other than the selected first electrode 22S forming the selected string.

In this way, a conduction path of carriers is formed in the selected string, and, thereupon, data can be written in the selected memory cell 48S. Note that data can also be collectively written in the memory cells between each of the plurality of the semiconductor films 14 in the selected first electrode 22S. In this case, a data voltage $V_{data}$ based on data desired to be recorded is applied to each of the bit lines 38. Moreover, an Off voltage $V_{off}$ of 0 V or less, for example, a voltage of 0 V, a ground voltage, is applied to the first conducting wirings 26 other than the selected first conducting wiring 26S so as not to form conduction paths in the strings other the selected string. In this case, each voltage is in a relationship of $V_{pgm}>V_{on+}>V_{th}>V_{on-}>V_{off}$ as well as in a relationship of $V_{pgm}>V_{buffer}>V_{boost}>V_{verify}>V_{src}$.

Next, data reading will be described. To read data, for example, the source voltage $V_{src}$ is applied to the source electrodes 32, a bit line voltage $V_{bl}$ of around 0.5 V is applied to the selected contact 30S, a reading voltage $V_{read}$ of around 7 V, that is, about the same as the conduction voltage $V_{pass}$ is applied to the selected first conducting wiring 26S, and the Off voltage $V_{off}$ is applied to the plurality of the first conducting wirings 26 other than the selected first conducting wiring 26S. Moreover, the Off voltage $V_{off}$ is applied to the second conducting wirings 28 other than the plurality of the second conducting wirings 28 connected to the gates of the transistors 24 connected to each of the first electrodes 22a forming the selected string, and the On voltage $V_{on+}$ is applied to the plurality of the second conducting wirings 28 which are the gate electrodes of the plurality of the transistors 24 forming the selected string other than the selected transistor 24S.

In this state, a reference voltage $V_{ref}$ applied to the selected second conducting wiring 28S is changed from 0 V to $V_{on+}$. At this time, a current flowing in the bit line 38 connected to the selected contact 30S is monitored, and data programed in the selected memory cell can be read as either "1" or "0" based on the reference voltage $V_{ref}$ upon the conduction of the selected path 54. For example, in the present embodiment, since the carriers trapped in the memory cell are electrons, the selected path 54 is not conducted unless a voltage higher than the voltage applied to the memory cells in which carriers are not trapped is applied to the memory cell in which the carriers are trapped. In this case, the voltages are in a relationship of $V_{read}>V_{bl}>V_{src}$.

Next, data erasing will be described. To erase data from a certain cell area of the semiconductor device 1, for example, $p^+$ conductive regions are provided in the cell areas at the opposite side of the step areas, an erasing voltage $V_{erase}$ of around 20 V is applied to these $p^+$ conductive regions, the Off voltage $V_{off}$ is applied to each of the first conducting wirings 26, and the On voltage $V_{on-}$ is applied to each of the second conducting wirings 28. Then, by opening the bit lines 38, positive holes flow into the cell area from the $p^+$ conductive regions, and these positive holes erase the data from the memory cell. In this case, the voltages are in a relationship of $V_{erase}>V_{on-}>V_{off}$.

As described above, according to the present embodiment, by providing the step region of the semiconductor device 1 in a direction orthogonal to the strings, a MaCS in which the areas of the cell areas are reduced can be formed. By reducing the areas of the cell areas, the integration degree of the memory cells can be enhanced, and the memory capacity of the MaCS can be increased.

Figure 18A:
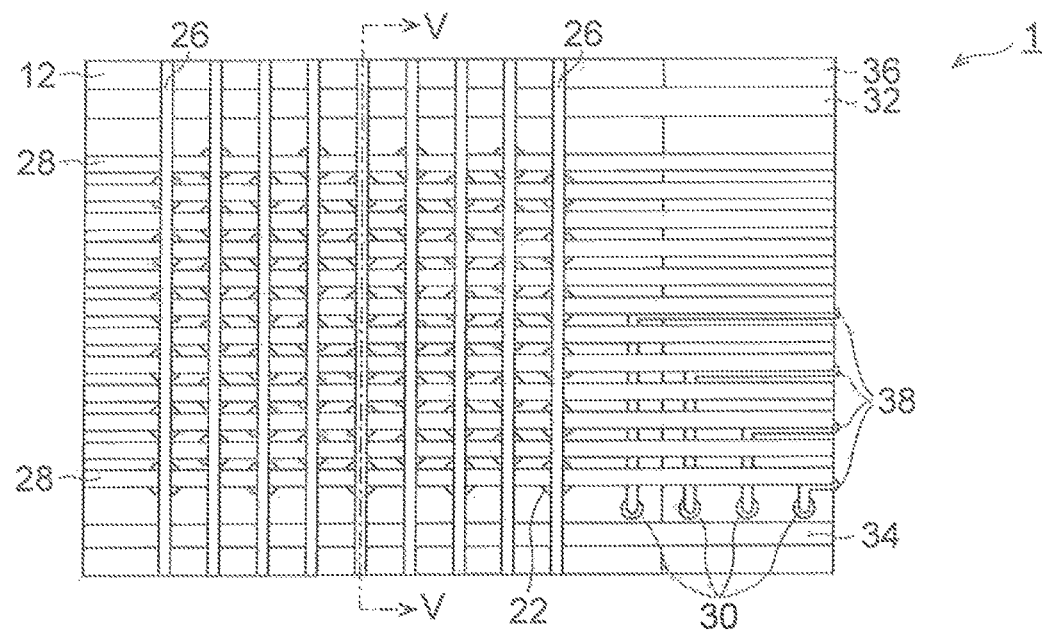
FIGS. 18A and 18B are views showing another example of the semiconductor device according to the first embodiment.
Figure 18B:
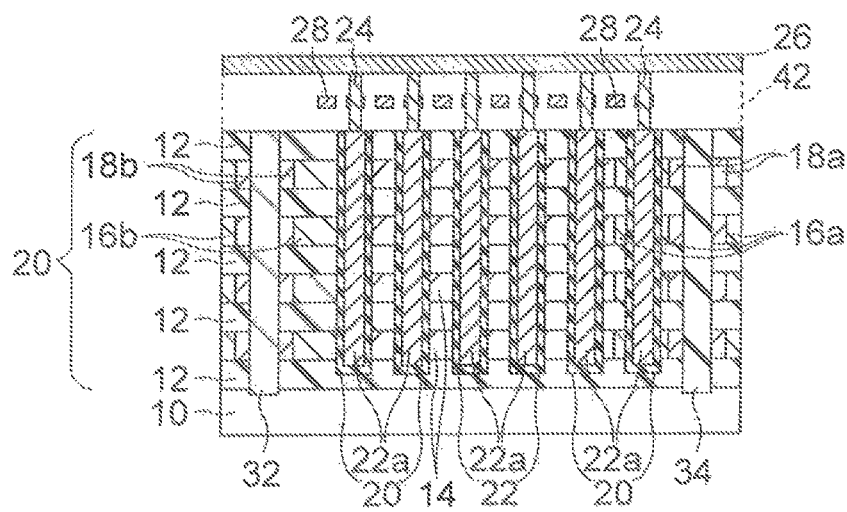

Note that the source electrodes 32 may be formed so as to be embedded in one of the trenches as shown in FIGS. 18A and 18B. In this way, the same operations can also be performed and the same effects can also be exerted as in the embodiment previously described. In this case, in the manufacturing process in FIGS. 14A to 14C, for example, a metal such as W is embedded in both trenches 52, only the trench 52 near the first low resistance regions 18a is opened using a common lithography technique, W is removed by chemical liquid such as hydrogen peroxide ($H_2O_2$), and formation in which W is embedded only near the sources is formed. Thereafter, like the process described in FIGS. 14A to 14C, an insulant is embedded in the trench 52 near the first low resistance regions 18a to form the region separation film 34, and the contacts 30 are subsequently formed. The subsequent process is the same as that in the embodiment previously described.

Moreover, the conductivity types of the conductive regions and the semiconductor films 14 have been described as one example in the present embodiment and may be changed as necessary due to the design and the like. For example, the n+ type conductive regions 18 can also be the p+ type conductive regions. In this case, the carriers flowing in the memory cell are positive holes h+. The same applies to the transistors 24. The transistors 24 are n type MOSFETs in the present embodiment, but may be p type MOSFETs.

Moreover, the number of the contacts 30 connected to each of the semiconductor films 14 is designed to be one. However, for example, the plurality of the contacts 30 may be connected to each one of the semiconductor films 14 to enhance the stability further after Ni silicide or the like is formed on the semiconductor films 14 on the side of the stepwise space so as not to be connected to the second low resistance regions 18b after the process of FIGS. 10A and 10B. Furthermore, the dispositions of the first electrode layers 22 are designed to be hexagonal lattices in the present embodiment, but may be square lattices.

Modification Example 1 of First Embodiment

In the embodiment previously described, all the first electrodes 22a are connected to the transistors 24, and the voltage applied to the gates of the plurality of the transistors 24 is controlled to form the conduction paths in the strings. However, in the present modification example, it is intended to form conduction paths in the strings by forming the transistors 24 above only the first electrodes 22a at the ends of the strings. Hereinafter, parts different from those in the embodiment previously described will be detailed.

Figure 19:
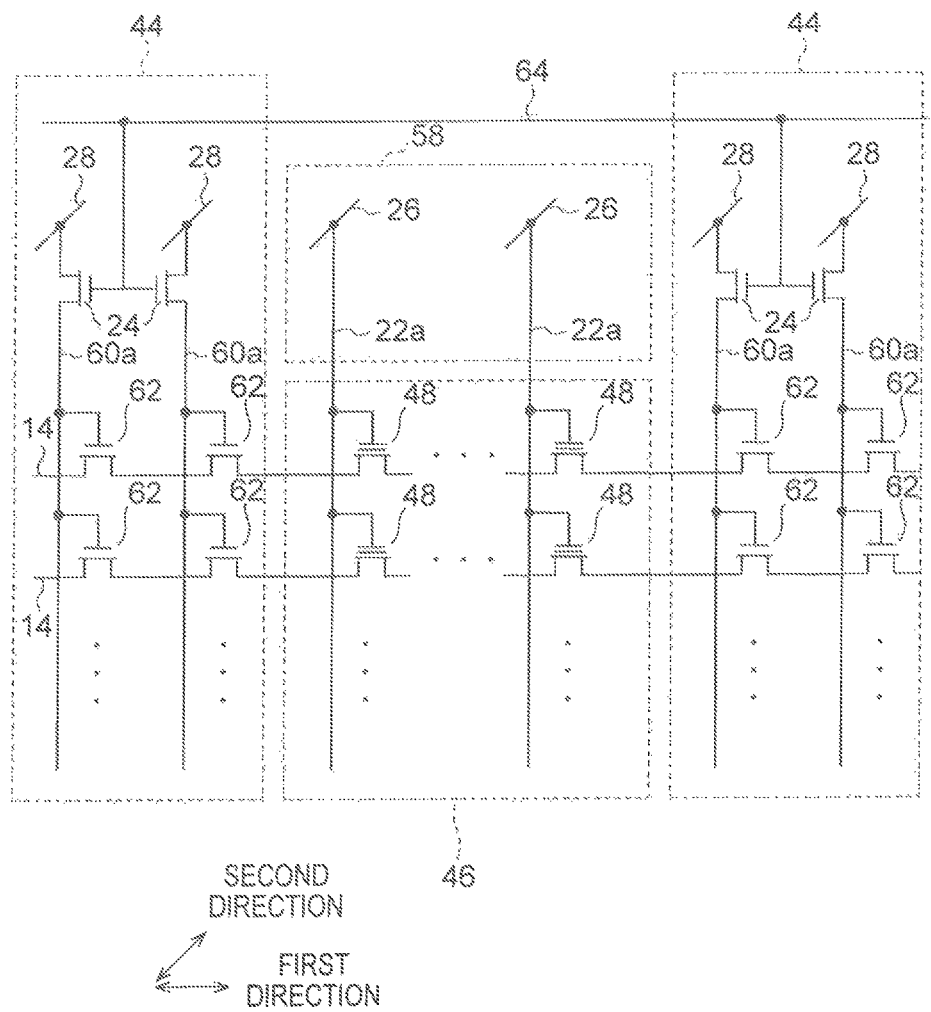
FIG. 19 is a circuit diagram at the front section of the semiconductor device according to the modification example 1 of the first embodiment.

FIG. 19 is a circuit diagram schematically showing a circuit of cell areas of a semiconductor device 1 according to the present modification example. As shown in this FIG. 19, the semiconductor device 1 according to the present modification example is configured so that a plurality of electrodes at both ends of electrodes constituting strings are connected to transistors 24, like the embodiment previously described, while electrodes in which memory cells are formed are not connected to the transistors 24.

As shown in FIG. 19, a circuit of memory cell regions of the semiconductor device 1 is configured by including string selecting circuits 44, a memory cell circuit 46 and a memory cell voltage applying circuit 58. Unlike the embodiment previously described, the string selecting circuits 44 are not above the memory cell circuit 46, but disposed so as to be connected to both ends of the memory cell circuit 46. Moreover, the memory cell voltage applying circuit 58 for applying a voltage to the memory cell circuit 46 is disposed above the memory cell circuit 46.

The string selecting circuits 44 are circuits for selecting a string to which a memory cell, in which data is read and written, belongs and are configured by including the plurality of the transistors 24, a plurality of second conducting wirings 28, a plurality of second electrodes 60a, a plurality of dummy cells 62 and a plurality of third conducting wirings 64.

The plurality of the first electrodes 22a as well as the plurality of the second electrodes 60a are arrayed so as to form hexagonal lattices in which the first electrode 22a and the second electrodes 60a makes the centers and vertexes of regular hexagons. The second electrodes 60a are electrodes plurally provided at each of both ends of the strings, and the structure of the second electrodes 60a are the same as that of the first electrodes 22a. The transistors 24 are disposed above the second electrodes 60a, and a voltage is applied to the second electrodes 60a by conducting these transistors 24.

The dummy cells 62 are equivalent to the memory cells 48 and form transistors in which the second electrodes 60a serve as the gates and the semiconductor films 14 serve as the channels. When a voltage is applied to the second electrodes 60a, depletion layers are formed around the dummy cells 62 of the semiconductor films 14. By contrast, in the present modification example, the transistors 24 are not disposed above the first electrodes 22a. Thus, when a voltage is applied to the first conducting wirings 26 on the first electrodes 22a, the depletion layers are formed around these first electrodes 22a in the semiconductor films 14. That is, the strings are controlled to conduct by conducting the transistors 24 disposed above these second electrodes 60a, forming the depletion layers around the dummy cells 62, and connecting to the depletion layers around the memory cells 48.

The third conducting wirings 64 correspond to the gate electrodes of the transistors 24, and the transistors 24 are controlled by applying a voltage to these third conducting wirings 64. That is, in brief, the transistors 24 are controlled by applying a gate voltage to the third conducting wirings 64 and applying a drain voltage to the second conducting wirings 28. As a result, it is possible to control whether to form the depletion layers around the dummy cells 62 in the semiconductor films 14 and form a conduction path in the selected string.

Since the memory cell circuit 46 has the same structure as that in the embodiment previously described, the detailed description thereof will be omitted. The memory cell voltage applying circuit 58 is a circuit for applying a voltage to the memory cells 48 for storing data, that is, the first electrodes 22a, and is configured by including the first conducting wirings 26 and the first electrodes 22a. By applying a voltage to the first conducting wirings 26, a voltage is applied to the first electrodes 22a. Thus, it is possible to read and write data and form conduction paths of the strings.

Figure 20A:
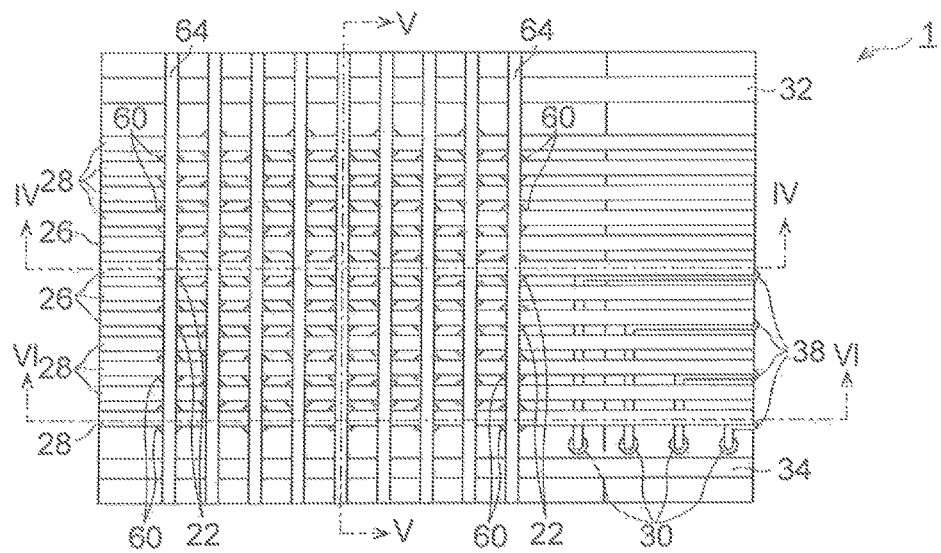
FIGS. 20A to 20D are a plan view of the semiconductor device according to the modification example 1 of the first embodiment and end views showing the front and left side thereof.
Figure 20B:
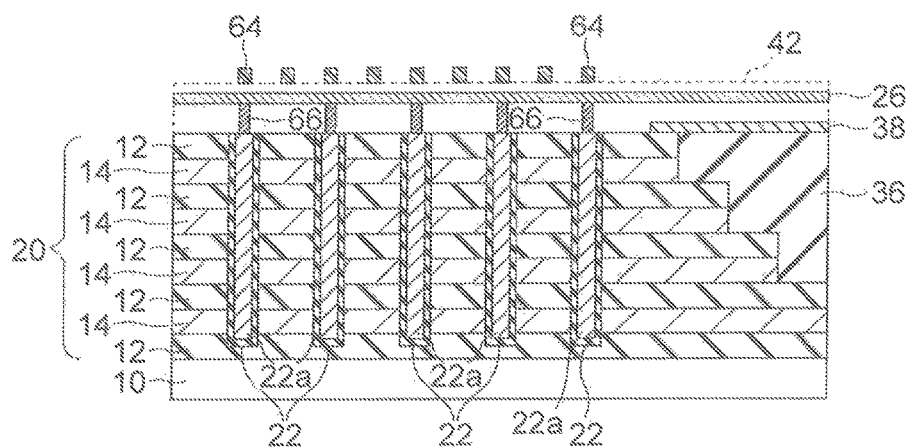
Figure 20C:
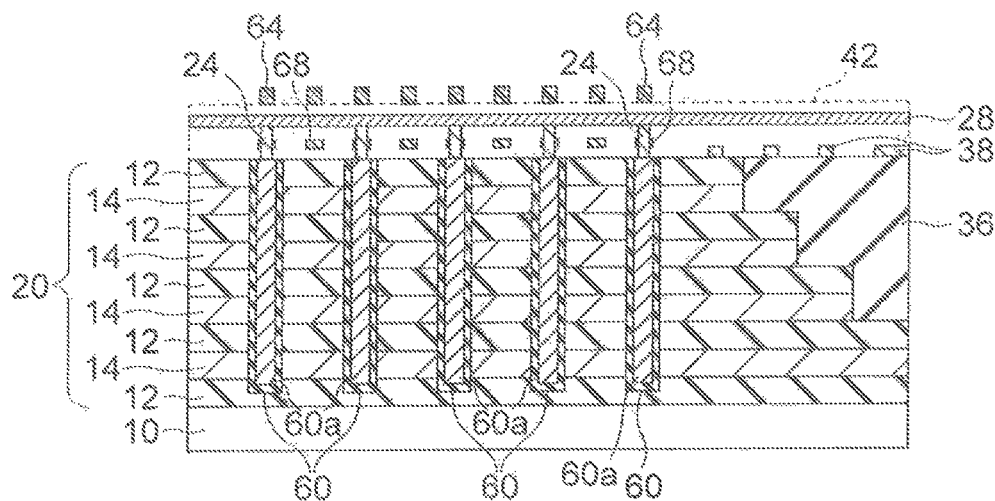
Figure 20D:
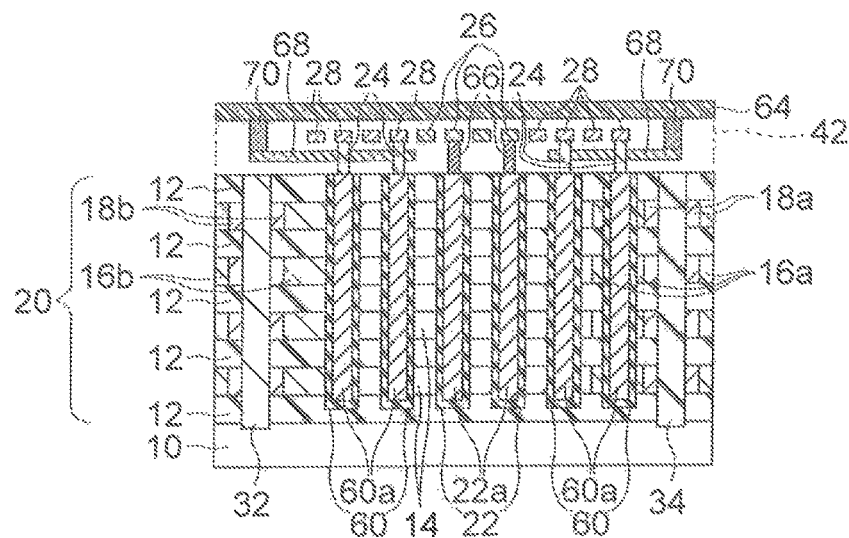

FIGS. 20A to 20D are views schematically showing the semiconductor device 1 according to the present modification example. FIG. 20A is a plan view of the semiconductor device 1, FIG. 20B is a IV-IV end view of FIG. 20A, and FIG. 20C is a VI-VI end view. These FIGS. 20B and 20C are end views of the semiconductor device 1 seen from the first direction. FIG. 20D is a V-V end view of FIG. 20A and an end view of the semiconductor device 1 seen from the second direction.

As shown in FIG. 20A, the basic configuration of the semiconductor device 1 according to the present modification example is the same as that of the semiconductor device 1 according to the embodiment previously described. However, among the plurality of the first electrode layers 22 forming the strings, each plurality of the first electrode layers 22 at both ends of the strings are referred to as second electrode layers 60. For example, in this FIG. 20A, among the first electrode layers 22 forming the strings, each two electrode layers at both ends are referred to as the second electrode layers 60. As shown in FIG. 20C, the second electrodes 60a previously described are formed inside these second electrode layers 60.

As previously described, the transistors 24 are disposed above the second electrodes 60a. To form conduction paths in the strings, a voltage is required to be applied at the same timing to the second electrodes 60a belonging to the same string (first direction). That is, the gate electrodes of the transistors 24 belonging to the same string are designed to be in the same wiring, thereby enabling the collective control. First, the first conducting wirings 26 connected the plurality of the first electrodes 22a along the second direction are disposed along the second direction, and the second conducting wirings 28 connected to the drain regions of the plurality of the transistors 24 along the second direction are also disposed along the second direction. Thereupon, by disposing, along the first direction, the third conducting wirings 64 connected to the gates of the transistors 24, this wiring can be achieved. That is, the positional relationship between the plurality of the conducting wirings along the first direction and the plurality of the conducting wirings along the second direction with respect to the third direction is a reversed disposition from that in the embodiment previously described.

FIG. 20B is one seeing the end surface of the semiconductor device 1 from the first direction in a plane with the first electrode layers 22. As shown in this FIG. 20B, first electrode contacts 66 are disposed above the first electrode layers 22. These first electrode contacts 66 are contacts for connecting the first electrodes 22a and the first conducting wirings 26. In this way, the plurality of the first electrodes 22a along the second direction are connected to the first conducting wirings 26 through the first electrode contacts 66. Moreover, the third conducting wirings 64 are disposed along the first direction above these first conducting wirings 26 through the interlayer insulating film 42.

Meanwhile, FIG. 20C is one seeing the end surface of the semiconductor device 1 from the first direction in a plane with the second electrode layers 60. As shown in this FIG. 20C, the transistors 24 are disposed so as to be connected to the second electrodes 60a, and gate lines 68 are disposed so as to serve as the gate electrodes of each of these transistors 24. Moreover, the drain regions of the transistors 24 are connected to the second conducting wirings 28, and these second conducting wirings 28 are formed along the second direction. The plurality of the third conducting wirings 64 are disposed through the interlayer insulating film 42 so as to be orthogonal to the second conducting wirings 28.

As shown in FIG. 20D, the gate lines 68 are formed along the first direction so as to interconnect the gates of the adjacent transistors 24 among the transistors 24 belonging to the same strings. Near each of the low resistance regions of the semiconductor layer 20, gate line contacts 70 are formed so as to connect these gate lines 68 and the third conducting wirings 64. In the string direction, for example, as shown in this FIG. 20D, among the electrode layers, each two electrode layers at both ends are the second electrode layers 60, and other electrode layers are the first electrode layers 22.

Next, a manufacturing process of the semiconductor device 1 according to the present modification example will be described. The process until forming the bit lines 38 shown in FIGS. 5A to 5C is the same as that in the embodiment previously described. Note that, in the present modification example, the source electrodes 32 are formed so as to fill the trench at the upper part of FIG. 20A, like the semiconductor device 1 shown in FIG. 17.

Figure 21A:
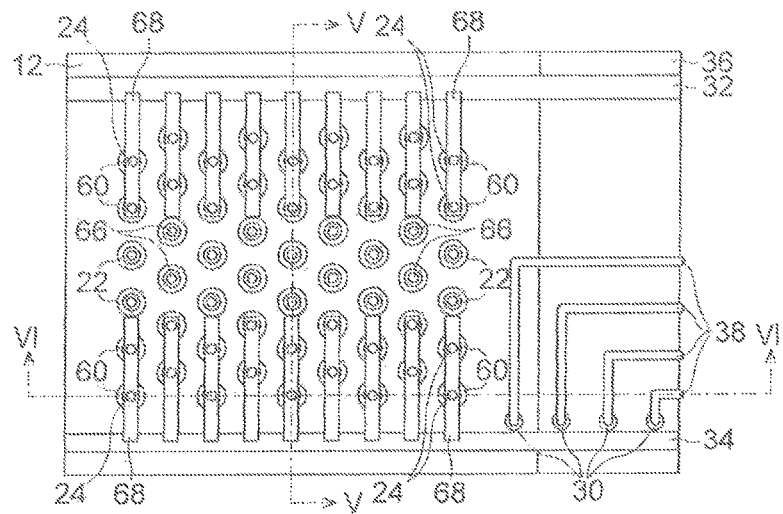
FIGS. 21A to 22C are views showing a manufacturing process of the semiconductor device according to the modification example 1 of the first embodiment.
Figure 21B:
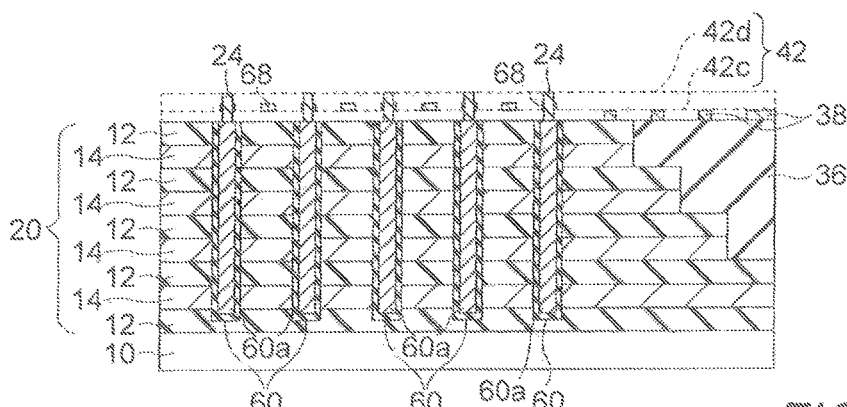
Figure 21C:
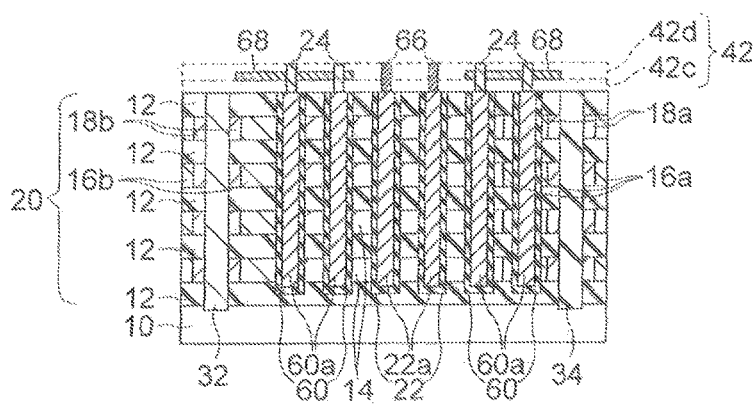

FIGS. 21A to 21C are views showing a process after forming the bit lines. FIG. 21B is a VI-VI end view of FIG. 21A, and FIG. 21C is a V-V end view of FIG. 21A. As shown in FIG. 21A, in this process, the plurality of the gate lines 68, the plurality of the transistors 24 and the plurality of the first electrode contacts 66 are created. First, as shown in FIGS. 21B and 21C, an interlayer insulating film 42c is formed on the semiconductor layer 20. On the interlayer insulating film 42c formed, the plurality of the gate lines 68 are formed above the second electrodes 60a. At this time, the gate lines 68 are not to be formed on the first electrodes 22a.

Next, an interlayer insulating film 42d is further formed on the interlayer insulating film 42c and the gate lines 68. Thereafter, as shown in FIGS. 21A and 21B, holes reaching the second electrodes 60a are opened in the third direction at the gate lines 68 and the interlayer insulating film 42. Together with these holes, holes reaching the first electrodes 22a are also opened in the third direction at the interlayer insulating film 42. Next, the first electrode contacts 66 are formed in the holes opened on the first electrodes 22a, and the transistors 24 are formed in the holes opened on the second electrodes 60a so that the gate lines 68 serve as the gate electrodes.

Figure 22A:
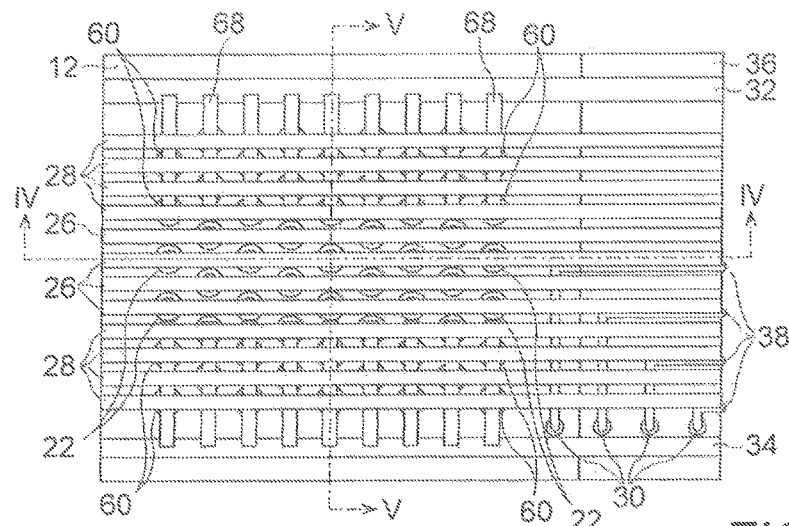
Figure 22B:
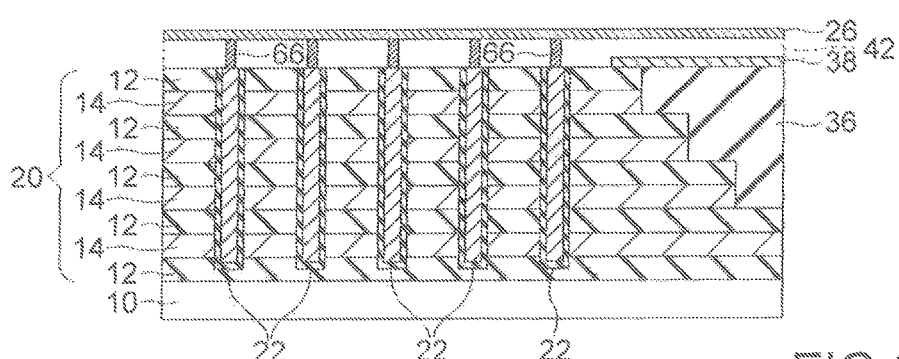
Figure 22C:
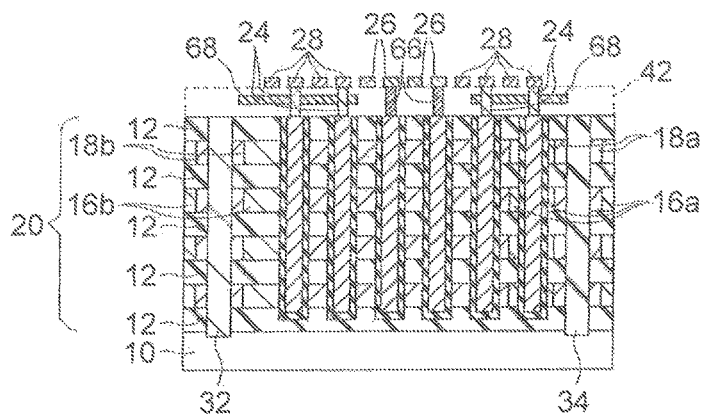

Next, the plurality of the first conducting wirings 26 and the plurality of the second conducting wirings 28 are formed. FIGS. 22A to 22C are views showing this process. FIG. 22B is a IV-IV end view of FIG. 22A, and FIG. 22C is a V-V end view of FIG. 22A. After the plurality of the transistors 24 and the plurality of the first electrode contacts 66 are formed, the plurality of the first conducting wirings 26 are formed along the second direction so as to be connected to the first electrode contacts 66 along the second direction. Together with this, the plurality of the second conducting wirings 28 are formed along the second direction so as to be connected to the drain regions of the plurality of the transistors 24 along the second direction.

As shown in FIG. 22A, the plurality of these first conducting wirings 26 and the plurality of these second conducting wirings 28 are formed in a direction orthogonal to the plurality of the gate lines 68 formed in the previous step. Moreover, as shown in FIG. 22C, the interlayer insulating film 42 insulates between the plurality of the gate lines 68 and the plurality of these first conducting wirings 26 and the plurality of these second conducting wirings 28.

Next, the interlayer insulating film 42 is further formed above the plurality of these first conducting wirings 26 and the plurality of these second conducting wirings 28, and a plurality of holes reaching the gate lines 68 are formed in the third direction on the interlayer insulating film 42 formed. The gate line contacts 70 are formed inside the plurality of these holes, and the plurality of the third conducting wirings 64 are formed along the first direction on the interlayer insulating film 42 so as to be connected to the plurality of the gate line contacts 70 along the first direction, thereby forming the semiconductor device 1 shown in FIGS. 20A to 20D.

The manufacturing process of the semiconductor device 1 according to the present modification example has been described above. Next, the operations of the semiconductor device 1 will be described. Note that, unless otherwise stated, the undermentioned voltages are voltages equivalent to the voltages according to the embodiment previously described. Like the embodiment previously described, an initial state is a state where no voltage is applied in the semiconductor device 1 and nothing is recorded in the memory cells.

First, a case of writing data in an arbitrary selected memory cell will be described. The boosting at the channel layers before writing data is the same as that in the embodiment previously described. That is, the boost voltage $V_{boost}$ (up to 5 V) is applied to the plurality of the bit lines 38 and the source lines 40, and the conduction voltage $V_{pass}$ (up to 8 V) is applied to the plurality of the first conducting wirings 26, the plurality of the second conducting wirings 28 and the plurality of the third conducting wirings 64. This makes the plurality of the transistors 24 being in a conduction state, the conduction paths are formed in the plurality of the strings, and the channel layers are boosted by the boost voltage $V_{boost}$. In this case, each voltage is in a relationship of $V_{pass} > V_{boost}$.

Next, the operation of writing data in the selected memory cell will be described. This operation is also almost the same as that in the embodiment previously described. That is, the source voltage $V_{arc}$ (up to 0 V) is applied to the source lines 40, and the data voltage $V_{data}$ (up to 4 V or up to 0 V) based on the data desired to be recorded in the selected memory cell is applied to the bit lines 38. Moreover, by applying a voltage to the plurality of the first conducting wirings 26 connected to the first electrodes 22a forming the selected string, the buffer voltage $V_{buffer}$ (up to 10 V) is applied to the first electrodes 22a forming the selected string.

In a state the voltages are being applied in this way, the writing voltage $V_{pgm}$ (up to 20 V) is applied to the selected memory cell, the verification voltage $V_{verify}$ (up to 4 V) is applied to the drains of the transistors 24 connected to the second electrodes 60a forming the selected string, and a voltage for conducting these transistors 24, for example, the On voltage $V_{on-}$ is applied to the gates thereof. That is, the writing voltage $V_{pgm}$ is applied to the selected first conducting wiring 26, the buffer voltage $V_{buffer}$ is applied to the first conducting wirings 26 connected other first electrodes 22a forming the selected string, the verification voltage $V_{verify}$ is applied to the second conducting wirings 28 connected to the drains of the transistors 24 on the second electrodes 60a forming the selected string, and the On voltage $V_{on-}$ is applied to the third conducting wirings 64 connected to the gates of the transistors 24 on the second electrodes 60a forming the selected string. Moreover, not to form the conduction paths in the strings other than the selected string, the Off voltage $V_{off}$ (up to 0 V) is applied to the first conducting wirings 26 other than the plurality of the first conducting wirings 26 connected to the first electrodes 22a forming the selected string. In this case, each voltage is in a relationship of $V_{pgm} > V_{on-} > V_{off}$ as well as in a relationship of $V_{pgm} > V_{buffer} > V_{boost} > V_{verify} > V_{src}$.

Next, data reading will be described. To read data, for example, the bit line voltage $V_{bl}$ (up to 0.5 V) is applied to the bit lines 38, the source voltage $V_{src}$ is applied to the source lines 40, and the reading voltage $V_{read}$ (up to 7 V) is applied to the plurality of the first conducting wirings 26 other than the selected first conducting wiring connected to the first electrodes 22a forming the selected string. To apply the conduction voltage $V_{pass}$ to the plurality of the second electrodes 60a forming the selected string, the conduction voltage $V_{pass}$ is applied to the drains of the plurality of the transistors 24 on the plurality of these second electrodes 60a, and the On voltage $V_{on}$. Is applied to the gates thereof. After the voltages applied in this way, the reference voltage $V_{ref}$ applied to the selected first conducting wiring is changed, and the data programed in the selected memory cell is read, like the embodiment previously described. In this case, the voltages are in a relationship of $V_{read} > V_{bl} > V_{src}$.

Next, data erasing will be described. In the present modification example, data is erased by using positive holes generated by gate induced drain leakage current (GIDL). The erasing voltage $V_{erase}$ of, for example, around 20 V is applied to both or either the bit lines 38 or the source lines 40. When the voltage is applied to either the bit lines 38 or the source lines 40, for example, when the erasing voltage $V_{erase}$ is applied to only the source lines 40, the bit lines 38 are opened. In this state, a GIDL voltage $V_{gidl}$ of, for example, 8 V is applied to the plurality of the second conducting wirings 28, and the On voltage $V_{on+}$ is applied to the plurality of the third conducting wirings 64, thereby generating GIDL in the second electrode layers 60 and producing positive holes. Then, by applying the Off voltage $V_{off}$ to the plurality of the first conducting wirings 26, the positive holes produced are injected into the cells, and data are erased from all the cells. In this case, the voltages are in a relationship of $V_{erase} > V_{on+} > V_{off}$.

As described above, also in the present modification example, by providing the step region of the semiconductor device 1 in a direction orthogonal to the strings, a MaCS in which the areas of the cell areas are reduced can be formed. By reducing the areas of the cell areas, the integration degree of the memory cells can be enhanced, and the memory capacity of the MaCS can be increased.

Moreover, according to the present modification example, the transistors 24 are not placed on the first electrodes 22a constituting the memory cells. Thus, for example, even when a voltage of around 20 V such as the writing voltage $V_{pgm}$ is given, the conduction paths are formed by the second electrodes 60a forming the strings, and it is needless to consider the leak current by the transistors 24. Therefore, the design can be more flexible.

Modification Example 2 of First Embodiment

In the modification example 1 described above, the transistors 24 are provided on the plurality of the electrodes at both ends among the electrodes forming the strings. However, in the present modification example, the conduction paths of the strings can be formed without using these transistors 24. Hereinafter, parts different from those in the embodiment and modification example previously described will be detailed.

Figure 23:
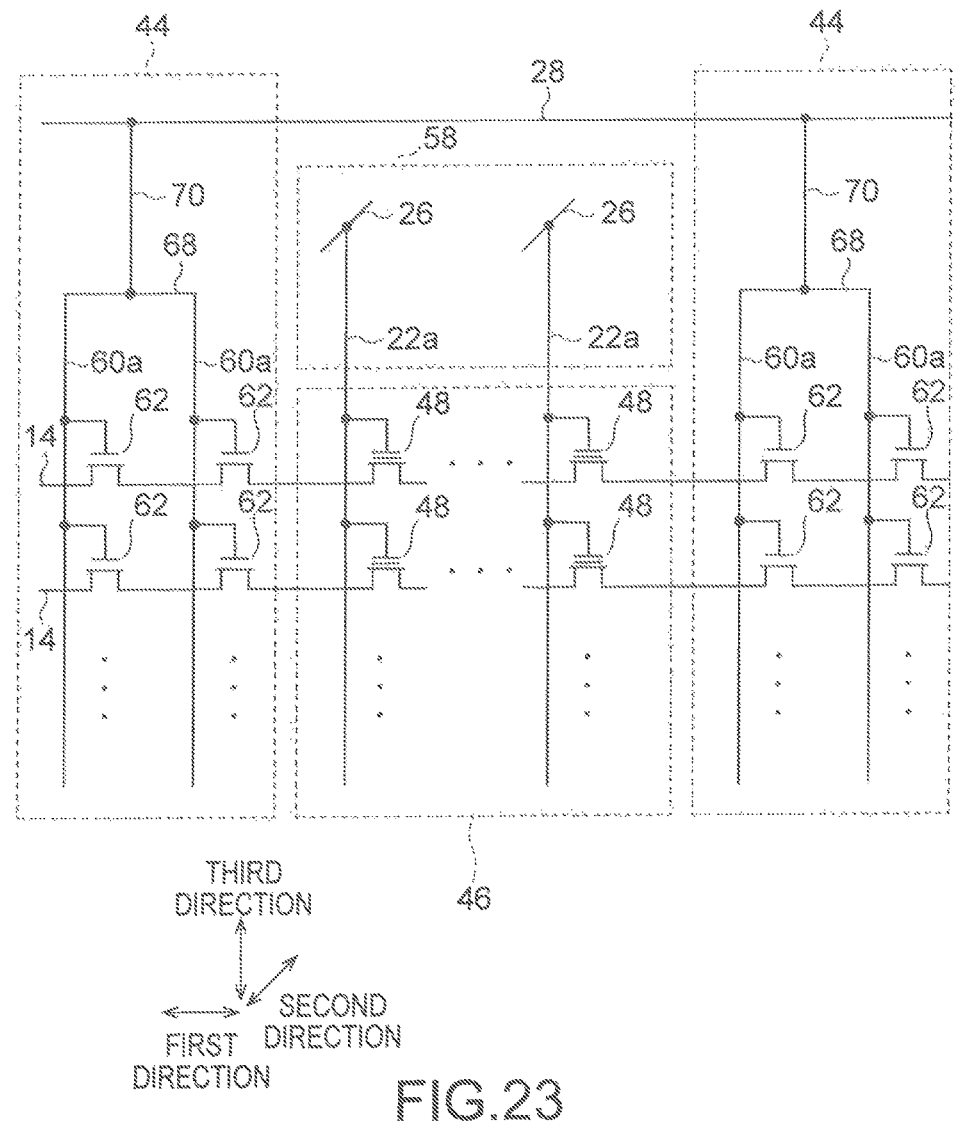
FIG. 23 is a circuit diagram at the front section of a semiconductor device according to the modification example 2 of the first embodiment.

FIG. 23 is a circuit diagram schematically showing a circuit of cell areas according to the present modification example. As shown in this FIG. 23, in the string selecting circuits 44, there are no transistors 24 on the second electrodes 60a. This is different from the modification example 1 previously described. These second electrodes 60a are connected to the second conducting wirings 28 through the gate lines 68 and the gate line contacts 70, not via the transistors. That is, in the present modification example, the voltage applied to the second conducting wirings 28 is applied to the second electrodes 60a without being controlled.

Figure 24A:
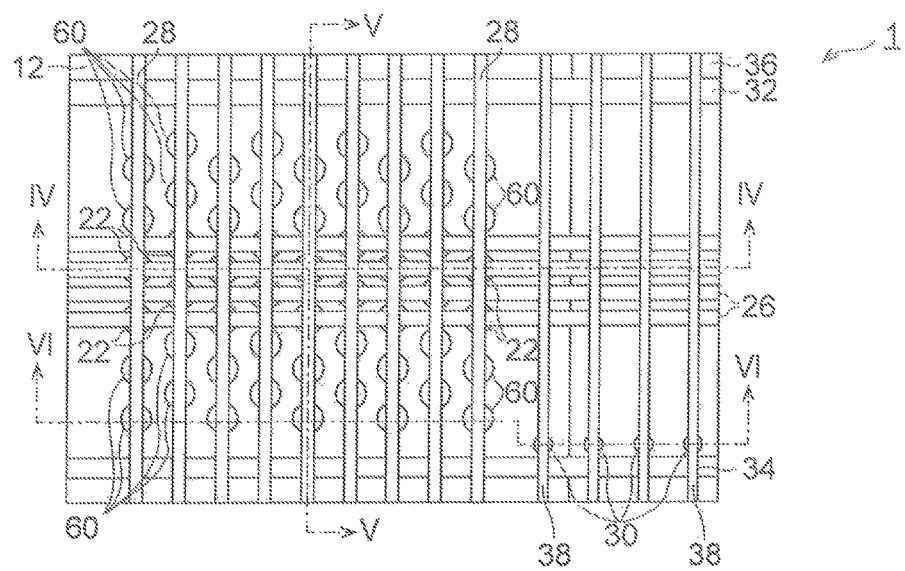
FIGS. 24A to 24D are a plan view of the semiconductor device according to the modification example 2 of the first embodiment and end views showing the front and left side thereof.
Figure 24B:
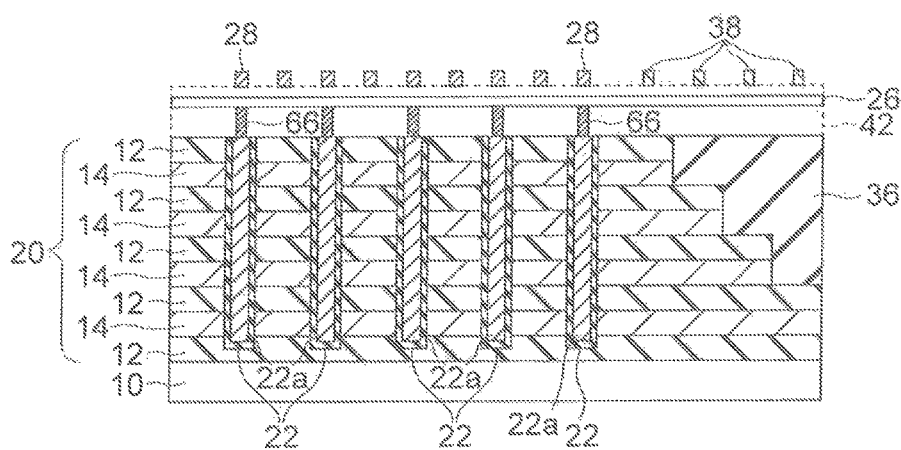
Figure 24C:
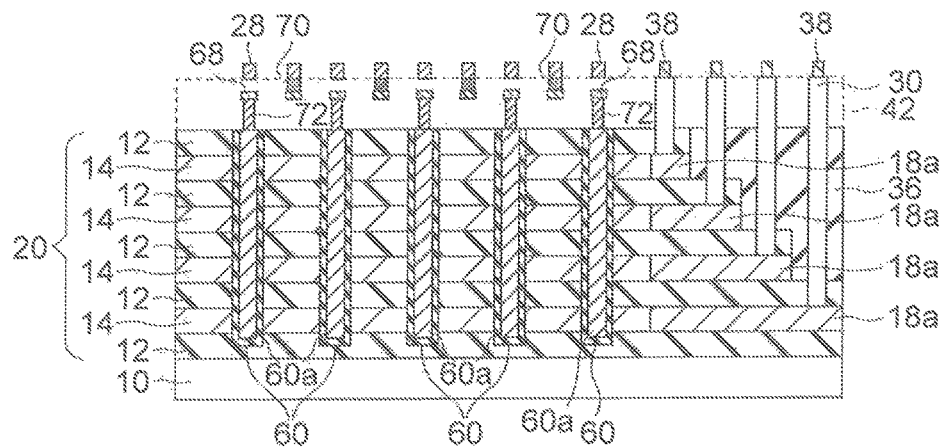
Figure 24D:
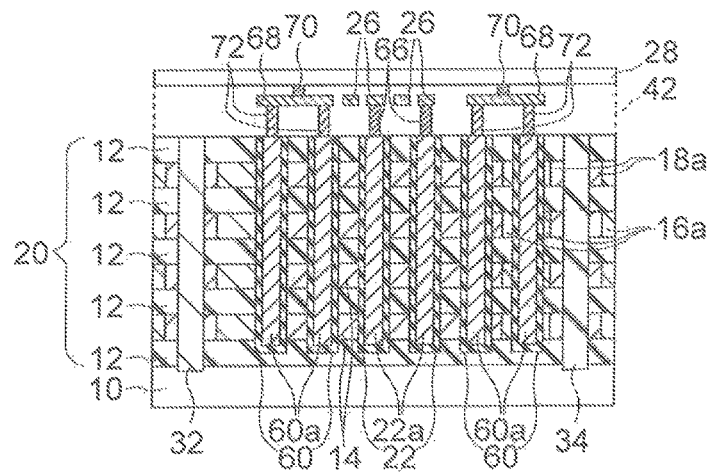

Next, wiring and the like according the present modification example will be described. FIGS. 24A to 24D are views schematically showing a simple overview of the semiconductor device 1 according to the present modification example. FIG. 24A is a plan view of the semiconductor device 1, FIG. 24B is a IV-IV end view of FIG. 24A, and FIG. 24C is a VI-VI end view. These FIGS. 24B and 24C are end views of the semiconductor device 1 seen from the first direction. FIG. 24D is a V-V end view of FIG. 24A and an end view of the semiconductor device 1 seen from the second direction.

As shown in FIG. 24A, the plurality of the first conducting wirings 26 are plurally formed along the second direction above the plurality of the first electrode layers 22 formed along the second direction. As shown in FIG. 24B, like the modification example previously described, the plurality of these first conducting wirings 26 are formed so as to be connected to the plurality of the first electrodes 22a along the second direction through the first electrode contacts 66.

The plurality of the second conducting wirings 28 are plurally formed above the first conducting wirings 26 along the first direction orthogonal to these first conducting wirings 26, that is, along the plurality of the first electrode layers 22 and the plurality of the second electrode layers 60, which form the strings. As shown in FIGS. 24B to 24D, the plurality of the second conducting wirings 28 are formed along the first direction above the plurality of the first conducting wirings 26, other wirings, the electrodes and the like through the interlayer insulating film 42.

Like the plurality of the second conducting wirings 28, the plurality of the bit lines 38 are formed along the second direction above the plurality of the first conducting wirings 26 so that each of the plurality of the bit lines 38 is connected to the contacts 30. As for the plurality of these bit lines 38, there is a difference in the design. Like the embodiment and the modification example previously described, the bit lines 38 may be formed on the semiconductor layer 20. Depending on the layout of the semiconductor device 1, the selection can be made as necessary.

As shown in FIGS. 24C and 24D, the plurality of the second electrode 60a are commonly connected to the gate lines 68 formed along first direction, through second electrode contacts 72 formed on each of the second electrodes 60a. Then, these gate lines 68 are connected to the second conducting wirings 28 formed along the first direction, through the gate line contacts 70. Thus, a common voltage is applied to the plurality of the second electrodes 60a forming the same string, through the second conducting wirings 28 formed above the second electrodes 60a.

Next, a manufacturing process of the semiconductor device 1 according to the present modification example will be described. Forming the trenches 52 and the process until forming the n$^+$ type conductive regions 16 and the low resistance regions 18, which are shown in FIGS. 13A and 13B, are the same as those in the embodiment previously described.

Figure 25A:
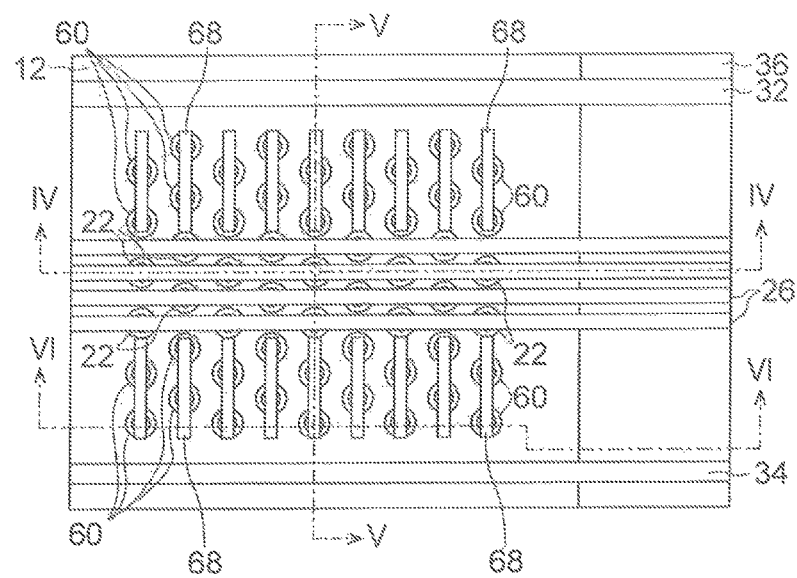
FIGS. 25A to 25D are views showing a manufacturing process of the semiconductor device according to the modification example 2 of the first embodiment.
Figure 25B:
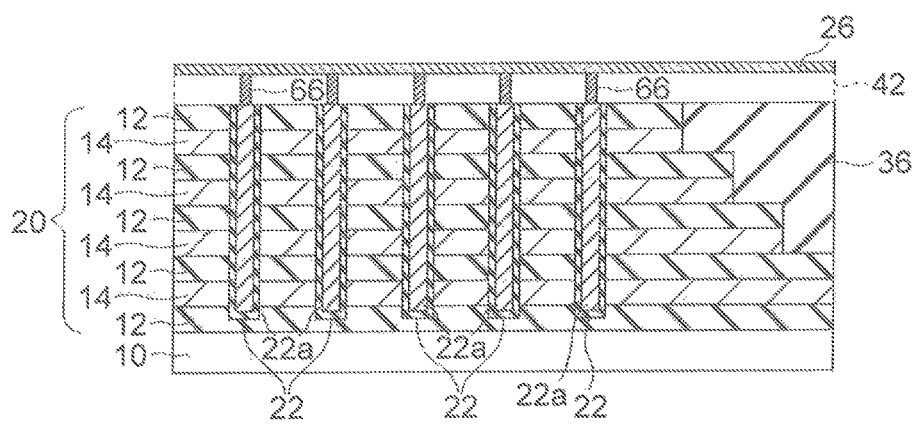
Figure 25C:
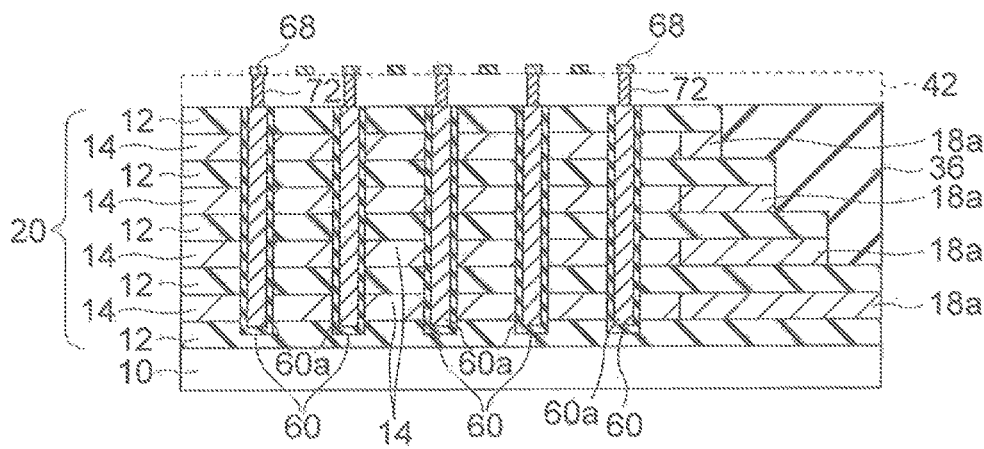
Figure 25D:
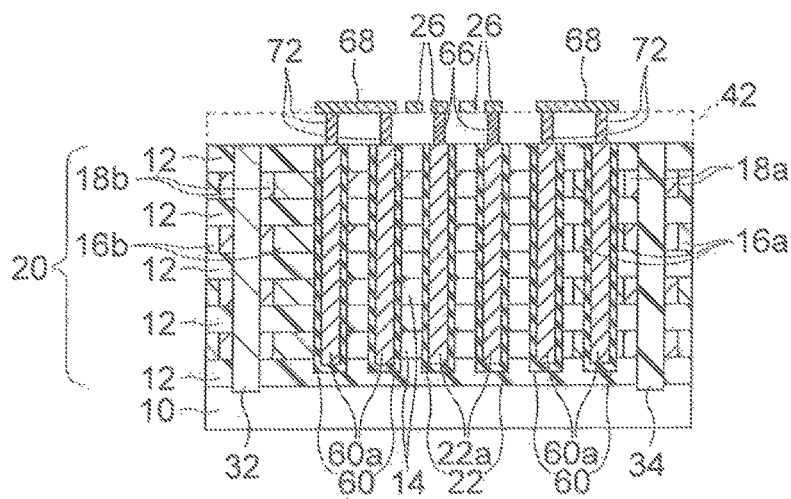

After the process shown in FIGS. 13A and 13B, the contacts from the electrodes and the conducting wirings are formed. FIGS. 25A to 25D are views showing a process of forming the contacts and forming the conducting wirings. FIG. 25A is a plan view of the semiconductor device 1 in the present process. FIG. 25B is a IV-IV end view of FIG. 25A, and FIG. 25C is a VI-VI end view. These FIGS. 25B and 25C are end views of the semiconductor device 1 seen from the first direction. FIG. 25D is a V-V end view of FIG. 25A and an end view of the semiconductor device 1 seen from the second direction. In this process, first, as shown in FIGS. 25A and 25D, the source electrodes 32 and the region separation films 34 are formed. This forming process is the same as that in the embodiment previously described.

Next, as shown in FIGS. 25B to 25D, the interlayer insulating film 42 is formed directly under the formation of the conducting wirings. After the interlayer insulating film 42 is formed, a plurality of holes reaching the plurality of the first electrodes 22a or the plurality of the second electrodes 60a are formed from the upper surface of the interlayer insulating film 42 along the third direction. Conductors of metal, polysilicon or the like are formed in the plurality of the holes formed, to form the plurality of the first electrode contacts 66 and the plurality of the second electrode contacts 72.

Next, the plurality of the first conducting wirings 26 and the plurality of the gate lines 68, which are shown in FIG. 25A, are formed. As shown in FIGS. 25B to 25D, the plurality of the first conducting wirings 26 are formed on the interlayer insulating film 42 along the second direction so as to be commonly connected the plurality of the first electrode contacts 66 along the second direction. As shown in FIGS. 25C and 25D, each of the plurality of the gate lines 68 is formed on the interlayer insulating film 42 along the first direction at both ends of the strings so as to be interconnected to the second electrodes 60a plurally formed at each of both ends forming the strings.

Next, as shown in FIGS. 24A to 24D, the interlayer insulating film 42 is further formed on the conducting wirings and the like formed as described above. Thereafter, as shown in FIGS. 24C and 24D, after the holes are opened in the interlayer insulating film 42 so as to reach the plurality of the gate lines 68, the plurality of the gate line contacts 70 connected to the plurality of these gate lines 68 are formed in the interlayer insulating film 42 formed. For example, the plurality of the gate line contacts 70 are formed so as to be connected to the upper part of the interlayer insulating film 42 in an intermediate region between the two second electrodes 60a forming strings at both ends of the strings.

Together with forming these gate line contacts 70, the plurality of contacts 30 are formed. After the holes penetrating the interlayer insulating film 42, the step forming interlayer film 36 and the insulating films 12 in the step areas in the third direction are formed so as to reach each of the semiconductor films 14, the plurality of these contacts 30 are formed by forming conductors inside the holes formed.

Next, the second conducting wirings 28 for interconnecting the plurality of the gate line contacts 70 formed on the same strings are formed on the interlayer insulating film 42 along the first direction. Together with forming these second conducting wirings 28, the plurality of the bit lines 38 are formed. The bit lines 38 are formed along the first direction so as to be connected to each of the contacts.

The manufacturing process of the semiconductor device 1 according to the present modification example has been described above. Next, the operations of the semiconductor device 1 will be described. Note that, unless otherwise stated, the undermentioned voltages are voltages equivalent to the voltages according to the embodiment previously described. Like the embodiment previously described, an initial state is a state where no voltage is applied in the semiconductor device 1 and nothing is recorded in the memory cells.

First, a case of writing data in an arbitrary selected memory cell will be described. The boosting at the channel layers before writing data is the same as that in the embodiment previously described. That is, the boost voltage $V_{boost}$ (up to 5 V) is applied to the plurality of the bit lines 38 and the source lines 40, and the conduction voltage $V_{pass}$ (up to 8 V) is applied to the plurality of the first conducting wirings 26 and the plurality of the second conducting wirings 28. This forms the conduction paths in the plurality of the strings, and the channel layers are boosted by the boost voltage $V_{boost}$. In this case, each voltage is in a relationship of $V_{pass} > V_{boost}$.

Next, the operation of writing data in the selected memory cell will be described. This operation is also almost the same as that in the embodiment previously described. That is, the source voltage $V_{src}$ (up to 0 V) is applied to the source lines 40, and the data voltage $V_{data}$ (up to 4 V or up to 0 V) based on the data desired to be recorded in the selected memory cell is applied to the bit lines 38. Moreover, by applying a voltage to the plurality of the first conducting wirings 26 connected to the first electrodes 22a forming the selected string, the buffer voltage $V_{buffer}$ (up to 10 V) is applied to the first electrodes 22a forming the selected string.

In a state where the voltages are being applied in this way, the writing voltage $V_{pgm}$ (up to 20 V) is applied to the selected memory cell, and the verification voltage $V_{verify}$ (up to 4 V) is applied to the selected second electrode. That is, the writing voltage $V_{pgm}$ is applied to the selected first conducting wiring 26, the buffer voltage $V_{buffer}$ is applied to the plurality of the first conducting wirings 26 connected to other first electrodes 22a forming the selected string, and the verification voltage $V_{verify}$ is applied to the selected second conducting wiring 28. Moreover, not to form the conduction paths in the strings other than the selected string, the Off voltage $V_{off}$ (up to 0 V) is applied to the plurality of the first conducting wirings 26 other than the first conducting wirings 26 connected to the first electrodes 22a forming the selected string. In this case, each voltage is in a relationship of $V_{pgm} > V_{buffer} > V_{boost} > V_{verify} > V_{src}$.

Next, data reading will be described. To read data, for example, the bit line voltage $V_{bl}$ (up to 0.5 V) is applied to the bit lines 38, the source voltage $V_{src}$ is applied to the source lines 40, and the reading voltage $V_{read}$ (up to 7 V) is applied to the plurality of the first conducting wirings 26 other than the selected first conducting wiring connected to the first electrodes 22a forming the selected string. To apply the conduction voltage $V_{pass}$ to the plurality of the second electrodes 60a forming the selected string, $V_{pass}$ is applied to the selected second conducting wiring 28. After the voltages are applied in this way, the reference voltage $V_{ref}$ applied to the selected first conducting wiring is changed, and the data programed in the selected memory cell is read, like the embodiment previously described. In this case, each voltage is in a relationship of $V_{read} > V_{bl} > V_{src}$.

Next, data erasing will be described. Also in the present modification example, like the modification example previously described, data will be erased by using positive holes generated by GIDL. The erasing voltage $V_{erase}$ (up to 20 V) is applied to both or either the bit lines 38 or the source lines 40. When the voltage is applied to either the bit lines 38 or the source lines 40, other conducting wirings are opened. For example, the erasing voltage $V_{erase}$ is applied to the source lines 40, and the bit lines 38 are opened. In this state, the GIDL voltage $V_{gidl}$ is applied to the plurality of the second conducting wirings 28, thereby generating GIDL in the second electrode layers 60 and producing positive holes. Then, by applying the Off voltage $V_{off}$ to the plurality of the first conducting wirings 26, the positive holes produced are injected into the cells, and data are erased from all the cells. In this case, the voltages are in a relationship of $V_{erase} > V_{on+} > V_{off}$.

As described above, also in the present modification example, by providing the step region of the semiconductor device 1 in a direction orthogonal to the strings, a MaCS in which the areas of the cell areas are reduced can be formed. By reducing the areas of the cell areas, the integration degree of the memory cells can be enhanced, and the memory capacity of the MaCS can be increased.

Moreover, according the present modification example, since the transistors are not provided above the plurality of the first electrodes 22a and the plurality of the second electrodes 60a, it is needless to consider a leak current generated when the transistors are turned off. As a result, it is needless to provide transistors with a gate length of around 1 μm, which have been required to suppress the leak current. Thus, the problem of withstand pressure is solved as well as the great reduction in size of the cells can be achieved to increase the integration degree of the memories.

Moreover, to read out, sense amplifiers capable of operating with low voltage are connected to the bit lines 38. When the bit lines 38 are opened upon data erasing, it is possible to decrease the number of sense amplifiers connected to the bit lines 38 and reduce chip areas.

Second Embodiment

In the embodiment previously described, the semiconductor device 1 capable of reducing the areas of the cell areas and enhancing the integration degree of the memories by placing the stepwise contacts in a direction orthogonal to the strings has been described. In addition to this, in the present embodiment, to suppress the leak current in the semiconductor films 14 from the conducted strings to the adjacent strings on the semiconductor films 14, the placement method of the first conducting wirings 26 has been changed. Hereinafter, parts different from those in the embodiment previously described will be detailed.

Figure 26A:
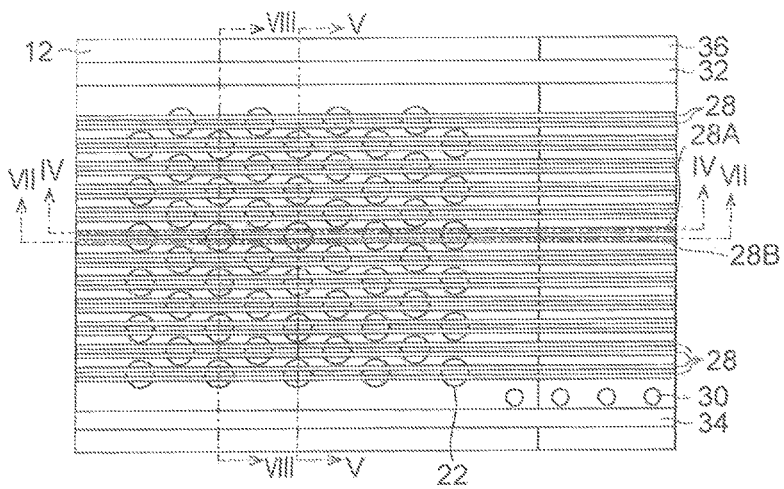
FIGS. 26A to 26E are a plan view of the semiconductor device according to the second embodiment and end views showing the front and left side thereof.

In FIGS. 26A to 26E, the number of the second conducting wirings 28 along the second direction has been increased compared to the semiconductor device 1 according the first embodiment. FIG. 26A is a plan view schematically showing the dispositions of the plurality of the second conducting wirings 28 at the upper surface of the semiconductor device 1 according to the present embodiment. For example, in the present embodiment, the number of the second conducting wirings 28 is doubled, and two second conducting wirings 28 are disposed on each of the first electrodes 22a. That is, the plurality of the second conducting wirings 28, a multiple of the number of the cells, are disposed with respect to the memory cells.

Figure 26B:
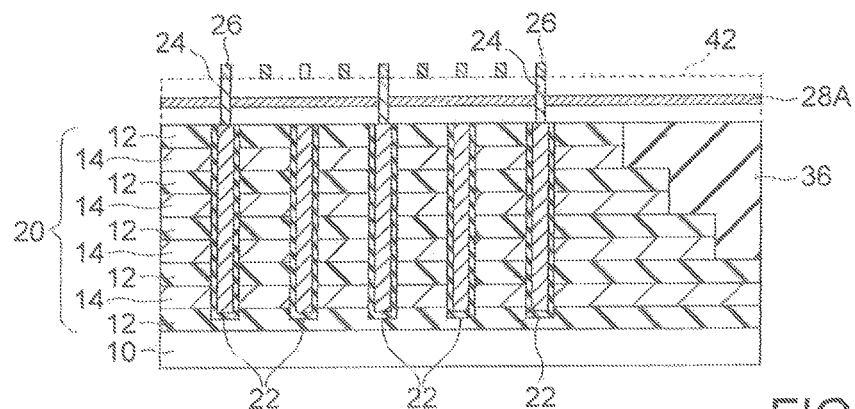
Figure 26C:
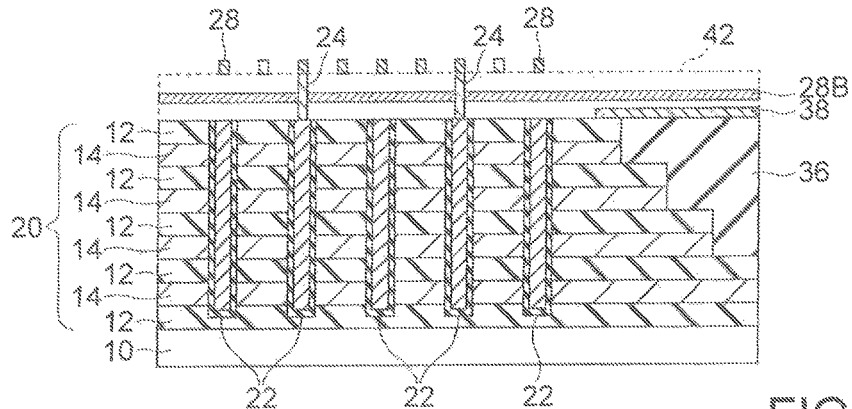

FIG. 26B is a IV-IV end view of FIG. 26A, including a second conducting wiring 28A, and FIG. 26C is a VII-VII end view of FIG. 26A, including a second conducting wiring 28B. These FIGS. 26B and 26C are end views of the semiconductor device 1 seen from the first direction and also show the plurality of the first conducting wirings 26 and the like. Moreover, these drawings are end views of the same first electrodes 22a in different planes, and each of the drawings is an end view at a plane passing the second conducting wirings 28 disposed on the first electrodes 22a.

As shown in FIG. 26B, the second conducting wiring 28A is disposed so as to serve as the gates of the transistors 24 on odd numbers of the first electrodes 22a, such as one, three and five from the left. By contrast, as shown in FIG. 26C, the second conducting wiring 28B is disposed so as to serve as the gates of the transistors 24 on even numbers of the first electrodes 22a, such as two and four from the left. That is, the plurality of the second conducting wirings 28 disposed on the same first electrodes 22a are connected to every two first electrodes 22a.

Figure 26D:
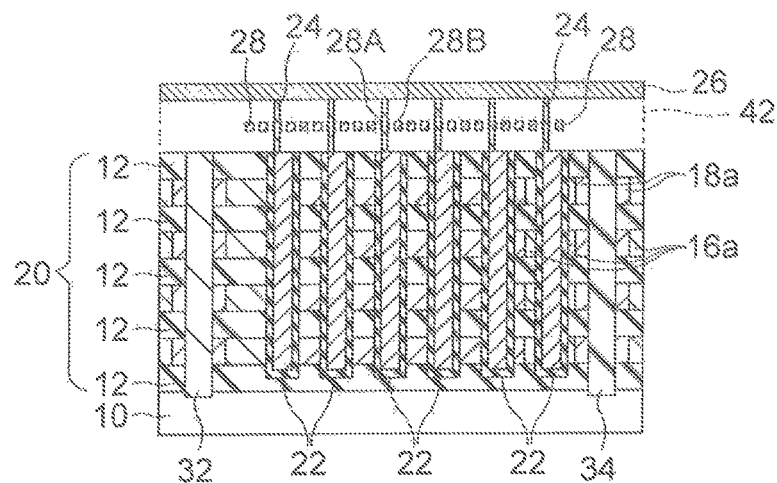
Figure 26E:
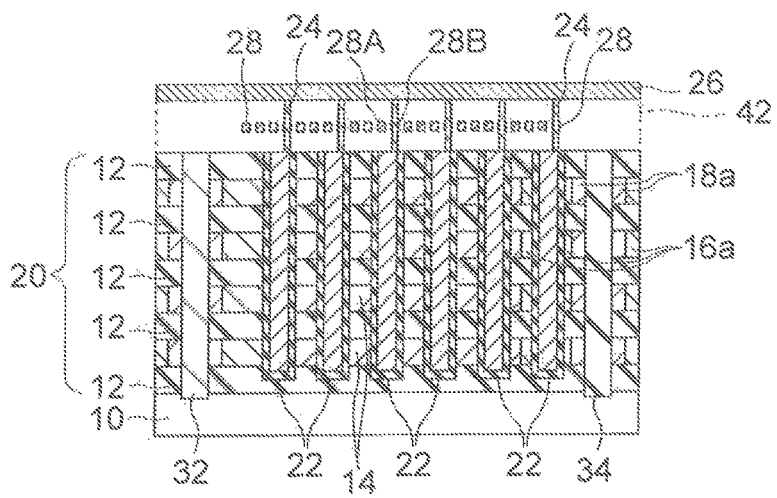

In addition, FIG. 26D is a V-V end view of FIG. 26A, and FIG. 26E is a VIII-VIII end view of FIG. 26A. These drawings are end views showing the semiconductor device 1 from the second direction. As shown in these FIGS. 26D and 26E, the first electrodes 22a are connected to, through the transistors 24, one of the two second conducting wirings 28 formed in line along the second direction on the first electrodes 22a. As shown in these drawings, for example, the transistors 24 are formed on the first electrodes 22a, closer to the source electrodes 32 in the first direction in FIG. 26D, and the transistors 24 are formed on the first electrodes 22a, closer to the side opposite to the source electrodes 32 in the first direction in FIG. 26E. The plurality of the second conducting wirings 28 are disposed so as to serve as the gates of these transistors 24.

Summing up these FIGS. 26A to 26E, in the present embodiment, the plurality of the second conducting wirings 28 are formed along the second direction and connected to, through the transistors 24, every predetermined number (two) of the first electrodes 22a among the plurality of the first electrodes 22a along the second direction.

The manufacturing process is basically the same as the one described in the first embodiment previously described. In forming the plurality of the transistors 24 and the process of forming the plurality of the second conducting wirings 28, by displacing the positions of the transistors 24 with respect to each of the first electrodes 22a along the first direction and by forming the increased doubled number of the second conducting wirings 28, the semiconductor device 1 according to the present embodiment can be formed.

Next, the operations of the semiconductor device 1 according to the present embodiment will be described. Note that data reading, data erasing and boosting operation upon data writing are the same as those in the first embodiment previously described.

To write data, as a preparation thereof, the semiconductor films 14 forming the channel layers are boosted. Thereafter, voltages are applied as follows. First, the data voltage $V_{data}$ based on the data to be recorded in the selected memory cell is applied between the bit lines 38 and the source lines 40. Then, the buffer voltage $V_{buffer}$ is applied to the first electrodes 22a forming the selected string and the strings adjacent to the selected string. Like the first embodiment previously described, applications of these voltages can be performed by controlling the drain voltage and the gate voltage of the transistors 24. Then, the Off voltage $V_{off}$ is applied to the strings adjacent to the adjacent strings at the opposite side of the selected string.

To write data, voltages applied to the selected first conducting wiring 26 and the selected second conducting wiring 28 are adjusted so as to apply the writing voltage $V_{pgm}$ to the selected first electrode 22a. In this way, even when the operation of writing data in the selected memory cell is performed, for example, only a voltage of 10 V, a difference between the writing voltage $V_{pgm}$ and the buffer voltage $V_{buffer}$, is applied between the selected string and the adjacent strings without being applied a high voltage of the writing voltage $V_{pgm}$=20 V.

As described above, also in the present embodiment, by providing the step region of the semiconductor device 1 in a direction orthogonal to the strings, a MaCS in which the areas of the cell areas are reduced can be formed. Moreover, according to the present embodiment, upon data writing in the selected memory cell, by applying the buffer voltage $V_{buffer}$ to the memory cells adjacent to the selected memory cell, it is possible to control the potential difference between the selected memory cell and the adjacent memory cells and suppress the leak current from the selected memory cell.

By suppressing the leak current from the selected memory cell in this way, it is possible to avoid mistakenly writing data in other memory cells. As a result, the stability of data accessing in the semiconductor device 1 is enhanced, and more reliable memories can be constructed.

Modification Example 1 of Second Embodiment

Figure 27A:
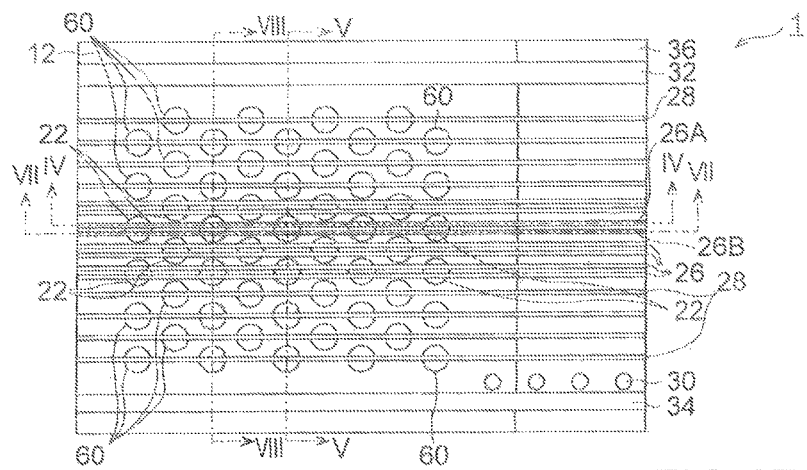
FIGS. 27A to 27E are a plan view of the semiconductor device according to the modification example 1 of the second embodiment and end views showing the front and left side thereof.

An embodiment, in which, like in the present embodiment, the pitches of the conducting wirings, which are formed along the second direction and control the voltage applied to the first electrodes 22a, are halved and the number of the conducting wirings is doubled, can be applied to the modification example 1 of the first embodiment previously described. FIGS. 27A to 27E show a semiconductor device 1, in which changes according to the present embodiment are applied to the modification example 1 of the first embodiment previously described. FIG. 27A is a plan view showing, from the top, the plurality of the first conducting wirings 26 and the plurality of the second conducting wirings 28 of the semiconductor device 1 in which the doubled number of the plurality of the first conducting wirings 26 are disposed.

As shown in this FIG. 27A, the pitches of the plurality of the second conducting wirings 28 for applying the voltage to the plurality of the second electrodes 60a are not changed from those in the modification example 1 of the first embodiment previously described while the pitches of the plurality of the first conducting wirings 26 for applying the voltage to the first electrodes 22a are half the pitches of those in the modification example 1 and the number of the plurality of the first conducting wirings 26 is double the number of those in the modification example 1.

Figure 27B:
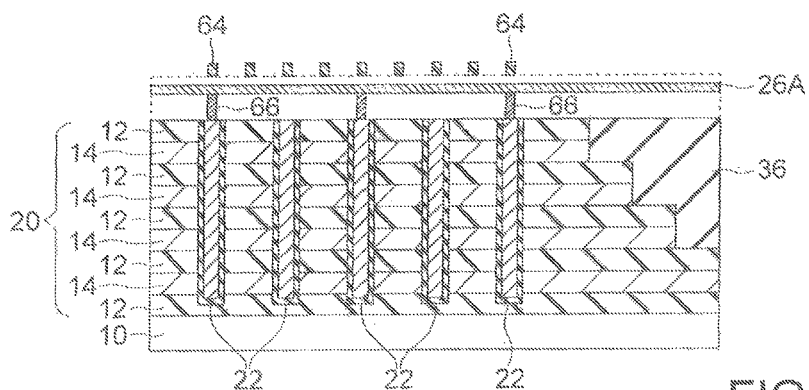
Figure 27C:
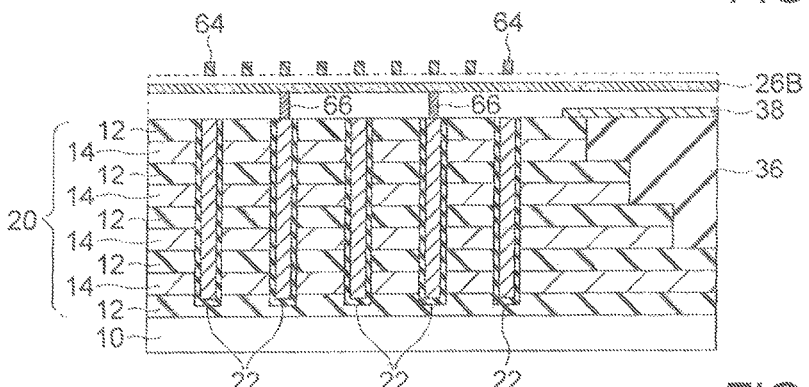

In addition, FIG. 27B is a IV-IV end view of FIG. 27A, and FIG. 27C is a VII-VII end view of FIG. 27A. These drawings are end views showing the semiconductor device 1 from the first direction. As shown in these FIGS. 27B and 27C, two first conducting wirings 26A and 268 disposed on the plurality of the same first electrodes 22a are connected to, through the first electrode contacts 66, every two of the plurality of the first electrodes 22a among the plurality of the first electrodes 22a formed under each of the conducting wirings.

Figure 27D:
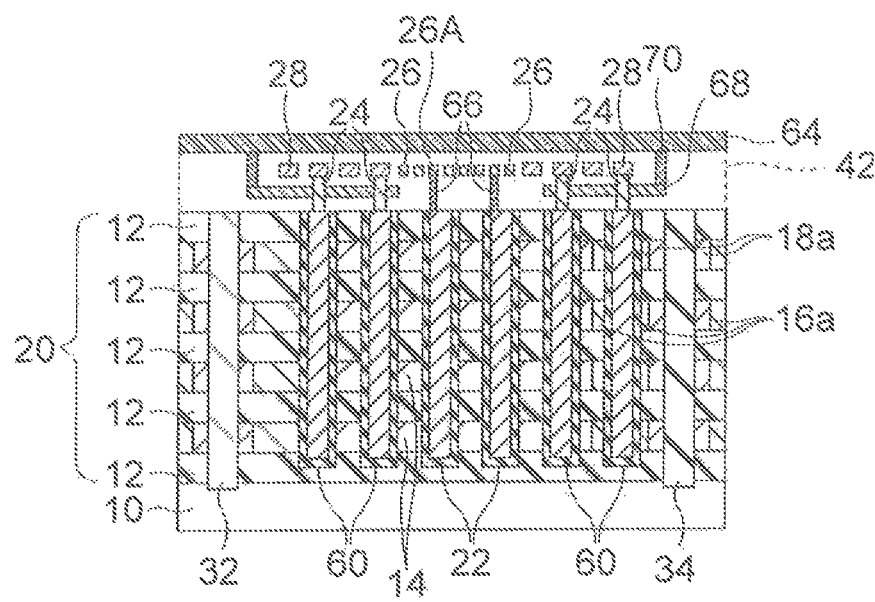
Figure 27E:
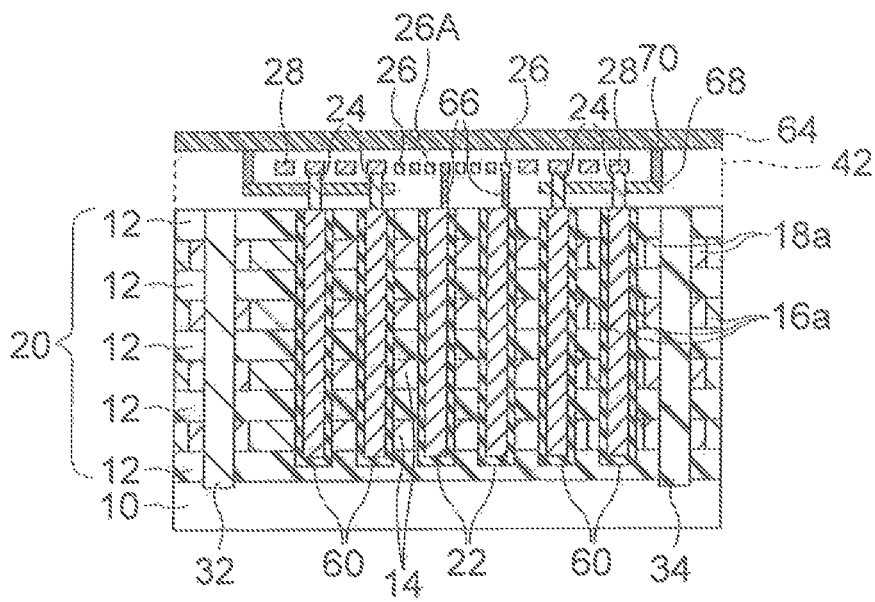

FIG. 27D is a V-V end view of FIG. 27A, and FIG. 27E is a VIII-VIII end view of FIG. 27A. These drawing are end views showing the semiconductor device 1 from the second direction. As shown in these FIGS. 27D and 27E, the first electrodes 22a are connected to, through the first electrode contacts 66, one of the two first conducting wirings 26 formed in line along the second direction on the first electrodes 22a. As shown in these drawings, for example, the first electrode contacts 66 are formed closer to the source electrodes 32 in the first direction in FIG. 27D and are formed closer to the side opposite to the source electrodes 32 in the first direction in FIG. 27E. As for the manufacturing process, like the second embodiment previously described, the positions of the first electrode contacts 66 and the positions and the number of the first conducting wirings 26 should be adjusted when the first electrode contacts 66 and the first conducting wirings 26 are formed.

Next, the operations of the semiconductor device 1 according to FIGS. 27A to 27E will be described. Note that data reading, data erasing and boosting operation upon data writing are the same as those in the modification example 1 of the first embodiment previously described.

To write data, as a preparation thereof, the semiconductor films 14 forming the channel layers are boosted. Thereafter, voltages are applied as follows. First, the data voltage $V_{data}$ based on the data to be recorded in the selected memory cell is applied between the bit lines 38 and the source lines 40. Then, the buffer voltage $V_{buffer}$ is applied to the first electrodes 22a forming the selected string and the strings adjacent to the selected string. That is, like the first embodiment previously described, the buffer voltage $V_{buffer}$ is applied to the plurality of the second conducting wirings 28, which are connected to the first electrodes 22a forming the selected string, and to the plurality of the second conducting wirings 28 connected to the first electrodes 22a forming the adjacent strings. Moreover, the Off voltage $V_{off}$ is applied to the plurality of the second conducting wirings 28 connected the first electrodes 22a forming the strings adjacent to the opposite side of the selected string of the adjacent strings.

To write data, the writing voltage $V_{pgm}$ is applied to the selected second conducting wiring 28 so as to apply the writing voltage $V_{pgm}$ to the selected first electrode 22a. In this way, even when the operation of writing data In the selected memory cell is performed, for example, only a voltage of 10 V, a difference between the writing voltage $V_{pgm}$ and the buffer voltage $V_{buffer}$, is applied between the selected string and the adjacent strings without being applied a high voltage of the writing voltage $V_{pgm}$=20 V.

As described above, even when the pitches of the plurality of the second conducting wirings 28 along the second direction in the modification example 1 of the first embodiment previously described are halved and the number of the second conducting wirings 28 is doubled, by providing the step region of the semiconductor device 1 in a direction orthogonal to the strings, a MaCS in which the areas of the cell areas are reduced can be formed. Moreover, according to the present embodiment, upon data writing in the selected memory cell, by applying the buffer voltage $V_{buffer}$ to the memory cells adjacent to the selected memory cell, it is possible to control the potential difference between the selected memory cell and the adjacent memory cells and suppress the leak current from the selected memory cell.

Modification Example 2 of Second Embodiment

Figure 28A:
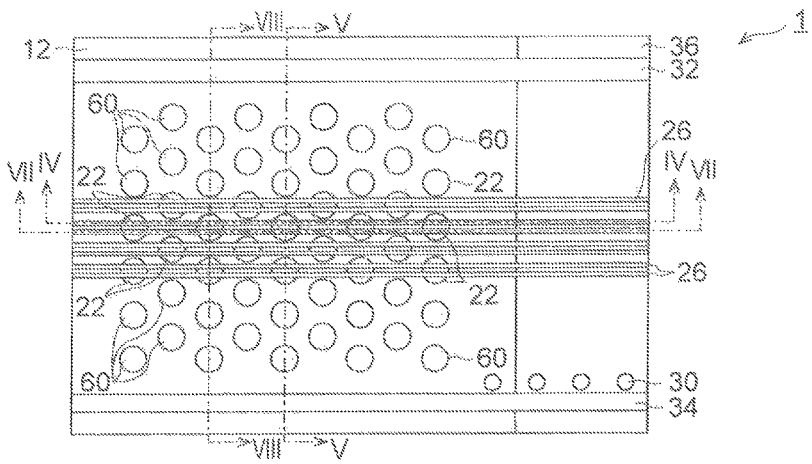
FIGS. 28A to 28E are a plan view of the semiconductor device according to the modification example 2 of the second embodiment and end views showing the front and left side thereof.

Furthermore, the same embodiment can be applied to the modification example 2 of the first embodiment previously described. FIGS. 28A to 28E are views showing a semiconductor device 1 in which the pitches of the first conducting wirings 26 in the modification example 2 of the first embodiment are halved. FIG. 28A is view showing, from the top, the plurality of the first conducting wirings 26 of the semiconductor device 1 in which the doubled number of the plurality of the first conducting wirings 26 are disposed. As shown in this FIG. 28A, the pitches of the plurality of the first conducting wirings 26 are half the pitches of those in the modification example 2 of the first embodiment, and the number of the first conducting wirings 26 is double the number of those in the modification example 2 of the first embodiment.

Figure 28B:
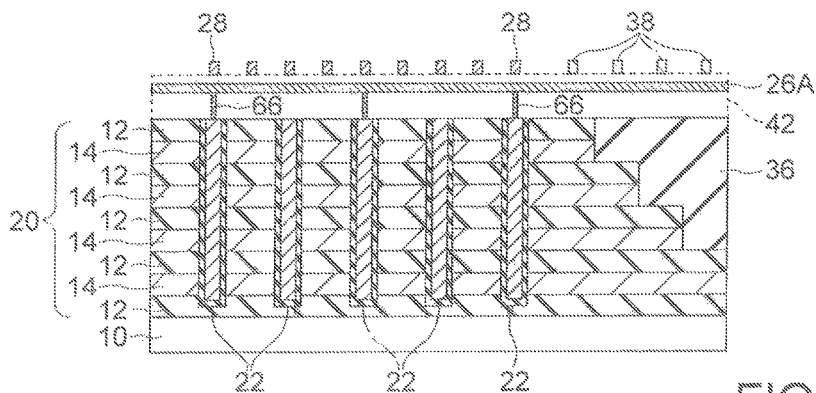
Figure 28C:
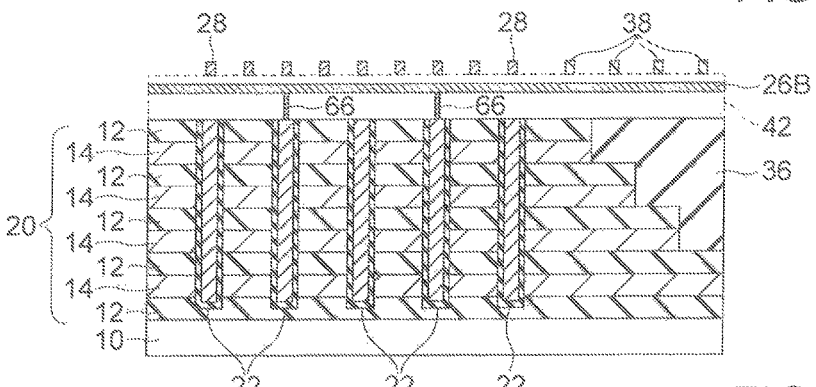

FIG. 28B is a IV-IV end view of FIG. 28A, and FIG. 28C is a VII-VII end view of FIG. 28A. These drawings are end views showing the semiconductor device 1 from the first direction. As shown in these FIGS. 28B and 28C, two first conducting wirings 26A and 26B disposed on the plurality of the same first electrodes 22a are connected to, through the first electrode contacts 66, every two of the plurality of the first electrodes 22a among the plurality of the first electrodes 22a formed under each of the conducting wirings.

Figure 28D:
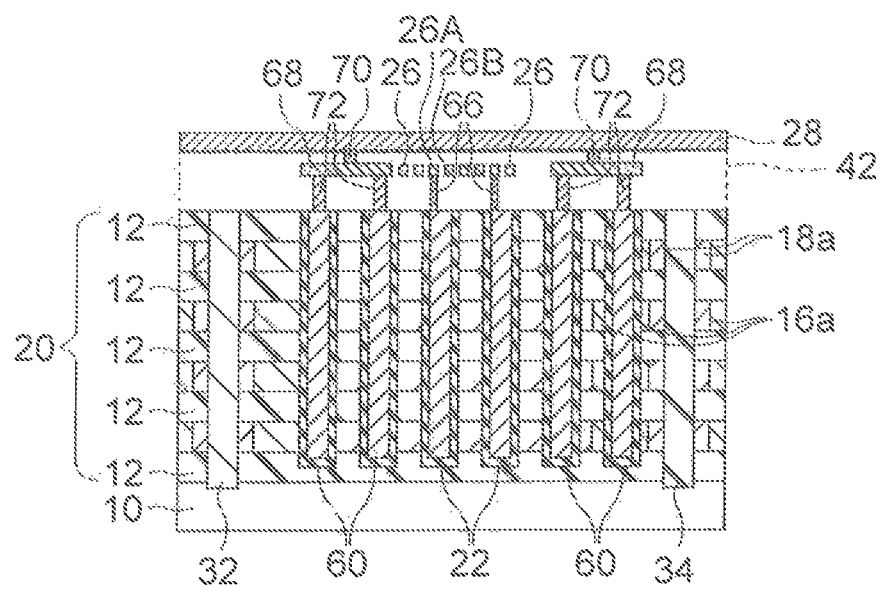
Figure 28E:
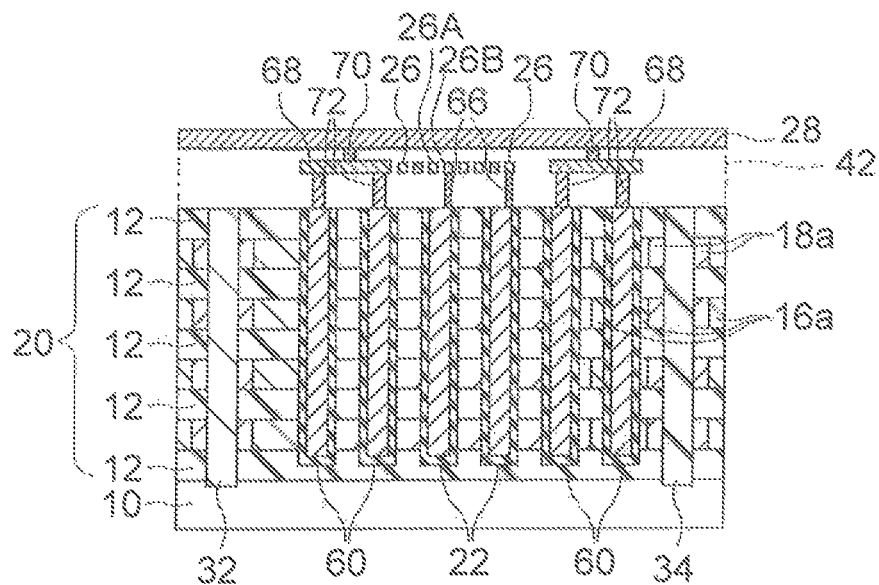

FIG. 28D is a V-V end view of FIG. 28A, and FIG. 28E is a VIII-VIII end view of FIG. 28A. These drawings are end views showing the semiconductor device 1 from the second direction. As shown in these FIGS. 28D and 28E, the first electrodes 22a are connected to, through the first electrode contacts 66, one of the two first conducting wirings 26 formed in line along the second direction on the first electrodes 22a. As shown in these drawings, for example, the first electrode contacts 66 are formed closer to the source electrodes 32 in the first direction in FIG. 28D and are formed closer to the side opposite to the source electrodes 32 in the first direction in FIG. 28E. As for the manufacturing process, like the second embodiment previously described, the positions of the first electrode contacts 66 and the positions and the number of the first conducting wirings 26 should be adjusted when the first electrode contacts 66 and the first conducting wirings 26 are formed.

Next, the operations of the semiconductor device 1 according to FIGS. 28A to 28E will be described using FIG. 29. Note that data reading and data erasing are the same as those in the modification example 2 of the first embodiment previously described. Hereinafter, the operation of writing data will be detailed.

Figure 29:
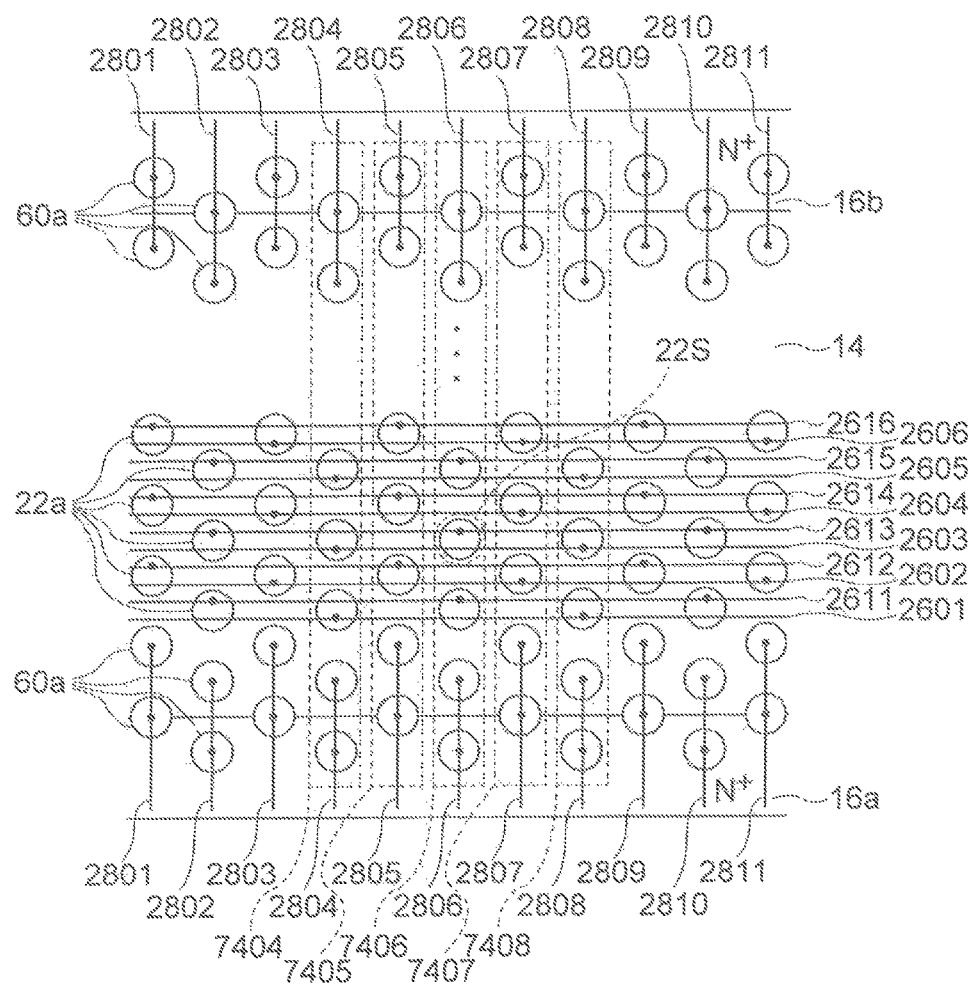
FIG. 29 is a view for explaining the operations of the semiconductor device according to the modification example 2 of the second embodiment.

FIG. 29 is a plan view showing a cutout of the upper surface of the semiconductor device 1 according to the present modification example and a schematic view showing the conducting wirings as straight lines so that the connection relationships between the plurality of the conducting wirings and the plurality of the electrodes can be seen. In this FIG. 29, nodes between the plurality of the conducting wirings and the plurality of the electrodes are illustrated.

Note that, for explanation, only the plurality of the first electrodes 22a and the plurality of the second electrodes 60a at the centers of the plurality of the first electrode layers 22 and the second electrode layers 60 are illustrated. In addition, the insulating films 12 are not illustrated. As shown in FIG. 29, the plurality of the first conducting wirings 2601 to 2616 are connected to the plurality of the first electrodes 22a, and the plurality of the second conducting wirings 2801 to 2811 are connected to the plurality of the second electrodes 60a. A string 7404 is a string in which the second electrodes 60a forming the string are connected to the second conducting wiring 2804, and is conducted by applying a voltage to the second conducting wiring 2804. Hereinafter, strings 7405 to 7408 are likewise connected to the second conducting wirings 2805 to 2808, respectively.

In FIG. 29, first, a case of writing data in the memory cell formed by the selected string 7406, to which the selected first electrode 22S belongs, and the semiconductor films 14 will be described. In this case, the adjacent strings are the strings 7405 and 7407.

First, to boost the channel potential of the entire cells, the semiconductor films 14 are boosted. In the boosting, the conduction voltage $V_{pass}$ (up to 8 V) is applied to the plurality of the first conducting wirings 2601 to 2616 and the plurality of the second conducting wirings 2801 to 2811, thereby making the plurality of the strings being in a conduction state, and, thereupon, the boost voltage $V_{boost}$ (up to 5 V) is applied to the first n$^+$ type conductive regions 16a and the second n$^+$ type conductive regions 16b. That is, the conduction voltage $V_{pass}$ is applied to the plurality of the first conducting wirings 26 in FIG. 28A and the second conducting wirings 28, and the boost voltage $V_{boost}$ is applied to the source electrode 32 and the plurality of the bit lines 38 in FIG. 28B.

In a state where the semiconductor films 14 are being boosted, the data voltage $V_{data}$ (up to 4 V or up to 0 V) based on the data desired to be recorded in the selected memory cell is applied to the first n$^+$ type conductive regions 16a, and the source voltage $V_{src}$ (up to 0 V) is applied to the second n$^+$ type conductive regions 16b. This data voltage $V_{data}$ can be set in each of the semiconductor films 14 based on the data to be recorded in a memory cell between each of the laminated semiconductor films 14 and the selected first electrode 22a.

As a preparation for writing, the buffer voltage $V_{buffer}$ (up to 10 V) is applied to the first conducting wirings 2611, 2613 and 2615 so as to form a conduction path in the selected string 7406. Moreover, the buffer voltage $V_{buffer}$ is applied to the first conducting wirings 2612, 2614 and 2616 and the first conducting wirings 2602, 2604 and 2606 so as to form conduction paths between the first electrodes 22a belonging to the adjacent strings 7405 and 7407 so as not to generate a leak current from the writing voltage $V_{pgm}$ when the writing voltage $V_{pgm}$ (20 V) is applied to the selected memory cell. Then, the Off voltage $V_{off}$ (up to 0 V) is applied to the first conducting wirings 2601, 2603 and 2605 so as not to form conduction paths in the strings 7404 and 7408.

In this state, voltage for writing in the selected memory cell is applied. In the example of FIG. 29, the writing voltage $V_{pgm}$ is applied to the first conducting wiring 2613 connected to the selected first electrode 22S, and the verification voltage $V_{verify}$ (up to 4 V) is applied to the selected second conducting wiring 2806 so as to verify the selected string 7406. In this way, the data based on the data voltage $V_{data}$ being applied to each of the semiconductor films 14 is recorded in the memory cell between the selected first electrode 22S and each of the semiconductor films 14. Note that, in this case, the Off voltage $V_{off}$ is applied to the plurality of the second conducting wirings 28 other than the selected second conducting wiring 2806 so as not to conduct other strings.

By applying the voltages in this way, the first n$^+$ type conductive regions 16a and the second n$^+$ type conductive regions 16b are conducted, electrons reach the selected memory cell, and the writing is performed. At this time, since the amount of electrons trapped in the first electrode layer 22 is different depending on a value of the data voltage $V_{data}$, this difference classifies the data into either "0" or "1" to be written. In this way, "0" or "1" of the data can be recorded by the voltage applied to the first n$^+$ type conductive regions 16a. In this case, each voltage is in a relationship of $V_{pgm} > V_{buffer} > V_{boost} > V_{verify} > V_{src}$.

Moreover, the writing voltage $V_{pgm}$ is applied to the plurality of the first electrodes 22a connected the selected first conducting wiring 2613. However, as for the first electrodes 22a other than the selected first electrode 22S connected to the selected first conducting wiring 2613, conduction paths to the first n$^+$ type conductive regions 16a are not formed, and thus electrons do not flow in so that data will not be recorded.

Next, a case of data reading will be described. First, the reading voltage $V_{read}$ is applied to the plurality of the first electrodes 22a other than the selected first electrode 22S forming the selected string 7406, and the conduction voltage $V_{pass}$ is applied to the plurality of the second electrodes 60a forming the selected string 7406. In the example of FIG. 29, the reading voltage $V_{read}$ is applied to the first conducting wirings 2611 and 2615, and the conduction voltage $V_{pass}$ is applied to the second conducting wiring 2806. The Off voltage $V_{off}$ is applied to the plurality of other first conducting wirings 2601, 2602, 2603, 2604, 2605, 2606, 2612, 2614, and 2616 and the plurality of other second conducting wirings 2801, 2802, 2803, 2804, 2805, 2807, 2808, 2809, 2810 and 2811. Moreover, the bit line voltage $V_{bl}$ (up to 0.5 V) is applied to the first n$^+$ type conductive regions 16a, and the source voltage $V_{src}$ is applied to the second n$^+$ type conductive regions 16b.

In this state, the reference voltage $V_{ref}$ is applied to the selected first electrode 22S, that is, the selected first conducting wiring 2613. This reference voltage $V_{ref}$ is a voltage changing from, for example, 0 V to 7 V, and the data programed in the selected memory cell can be read by a value of the reference voltage $V_{ref}$ conducting the selected string 7406 in the process of changing the reference voltage $V_{ref}$, that is, conducting the first n$^+$ type conductive regions 16a and the second n$^+$ type conductive regions 16b. The conduction of the selected string 7406 can be detected in the bit lines 38 from the first n$^+$ type conductive regions 16a through the first low resistance regions 18a. In this case, the voltages are in a relationship of $V_{read} > V_{bl} > V_{src}$.

Next, a case of data erasing will be described. To erase the data using GIDL, the erasing voltage $V_{erase}$ (up to 20 V) is applied to both or either the first n$^+$ type conductive regions 16a or the second n$^+$ type conductive regions 16b. That is, the erasing voltage $V_{erase}$ is applied to both or either the plurality of the bit lines 38 or the source electrodes 32. When the erasing voltage $V_{erase}$ is applied to either the bit lines 38 or the source electrodes 32, the other is opened. In this state, the Off voltage $V_{off}$ is applied to the plurality of the first electrodes 22a, and the GIDL voltage $V_{gidl}$ (up to 8 V) is applied to the plurality of the second electrodes 60a. By applying the voltages in this way, GIDL is generated between the n$^+$ type conductive regions 16 and the plurality of the second electrodes 60a, and positive holes are produced. The positive holes produced are injected into the memory cell through each of the semiconductor films 14, and data are erased from all the cells.

When p$^+$ type conductive layers are placed at ends of the memory cell regions, the erasing voltage $V_{erase}$ is applied to the source electrodes 32, the plurality of the bit lines 38 and the plurality of the second conducting wirings 28 are opened, and the Off voltage $V_{off}$ is applied to the plurality of the first conducting wirings 26. In this way, the positive holes flow in from the p$^+$ type conductive layers, and the positive holes are injected into the memory cell, and data are erased from all the cells.

As described above, even when the pitches of the plurality of the first conducting wirings 26 along the second direction in the modification example 2 of the first embodiment previously described are halved and the number of the first conducting wirings 26 is doubled, by providing the step region of the semiconductor device 1 in a direction orthogonal to the strings, a MaCS in which the areas of the cell areas are reduced can be formed. Moreover, according to the present embodiment, upon data writing in the selected memory cell, by applying the buffer voltage $V_{buffer}$ to the memory cells adjacent to the selected memory cell, it is possible to control the potential difference between the selected memory cell and the adjacent memory cells and suppress the leak current from the selected memory cell.

Note that, although the connections are made to every two of the first electrodes 22a in the present embodiment, the connections can be made to every three or more predetermined number of the first electrodes 22a. By making connections to every three or more predetermined number of the first electrodes 22a, the potential difference between the adjacent strings can be further reduced, and the stability and the reliability can be further enhanced.

Moreover, the voltages indicated by the specific numerical values applied to each of conducting wirings and the like have been demonstrated as one example. The values may be changed in a range capable of accessing data stored or to be stored in the memory cell depending on the performance of the transistors and the structure of the electrode layers.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device, comprising:
a substrate;

a semiconductor layer on the substrate, the semiconductor layer being formed by alternately laminating a plurality of insulator films and a plurality of semiconductor films;

a plurality of first electrodes formed in the semiconductor layer by being arrayed in a first direction and a second direction and by penetrating the plurality of the insulator films and the plurality of the semiconductor films in a third direction, the first direction being horizontal to a surface of the semiconductor layer, the second direction intersecting with the first direction and being horizontal to the surface of the semiconductor layer, the third direction intersecting with the first direction and the second direction;

a plurality of data storage region provided between each of the semiconductor films and each of the first electrodes;

a plurality of first conductive regions provided at one end of each of the semiconductor films in the first direction; and a plurality of contacts connected to one end of one of the first conductive regions in the second direction, in which connection parts between each of the contacts and the one of the first conductive regions are formed stepwise along the second direction.

2. The semiconductor device according to claim 1, further comprising transistors above the semiconductor layer, the transistors being connected to each of the first electrodes.

3. The semiconductor device according to claim 1, further comprising:

first conducting wirings connected to the first electrodes along the second direction;

a plurality of second electrodes formed in the semiconductor layer by being plurally provided in the first direction at each of both ends of the first electrodes along the first direction and by penetrating the plurality of the insulator films and the plurality of the semiconductor films in the third direction;

transistors connected to each of the second electrodes;

a plurality of second conducting wirings connected to the second electrodes through the plurality of the transistors along the second direction; and a plurality of third conducting wirings connected to gates of the plurality of the transistors along the first direction.

4. The semiconductor device according to claim 1, further comprising:

a plurality of first conducting wirings connected to the plurality of the first electrodes along the second direction;

a plurality of second electrodes formed in the semiconductor layer by being plurally provided in the first direction at each of both ends of the first electrodes along the first direction and by penetrating the plurality of the insulator films and the plurality of the semiconductor films in the third direction; and a plurality of second conducting wirings connected to the plurality of the second electrodes along the first direction.

5. The semiconductor device according to claim 1, further comprising a plurality of conducting wirings connected to every predetermined number of the plurality of the first electrodes among the plurality of the first electrodes along the second direction.

6. The semiconductor device according to claim 1, further comprising a plurality of second conductive regions provided at the other end of semiconductor layer in the first direction.

7. The semiconductor device according to claim 6, further comprising tabular third electrodes along the second direction, the third electrodes being formed in the semiconductor layer by penetrating the plurality of the insulator films and the plurality of the semiconductor films in the third direction and being electrically connected to each of the second conductive regions.

8. The semiconductor device according to claim 6, further comprising:

first low resistance regions provided in each of the first conductive regions, at an end opposite to the plurality of the first electrodes in the first direction; and second low resistance regions provided in each of the second conductive regions, at an end opposite to the plurality of the first electrodes in the first direction, wherein the plurality of the contacts are connected stepwise to each of the first conductive regions through the first low resistance regions provided in each of the first conductive regions.

* * * * *